(12) United States Patent
Hopkins et al.

(10) Patent No.: US 11,812,610 B2
(45) Date of Patent: Nov. 7, 2023

(54) THREE-DIMENSIONAL MEMORY WITH CONDUCTIVE RAILS IN CONDUCTIVE TIERS, AND RELATED APPARATUS, SYSTEMS, AND METHODS

(71) Applicant: Micron Technology, Inc., Boise, ID (US)

(72) Inventors: John D. Hopkins, Meridian, ID (US); Rita J. Klein, Boise, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 102 days.

(21) Appl. No.: 16/539,700

(22) Filed: Aug. 13, 2019

(65) Prior Publication Data
US 2021/0050361 A1 Feb. 18, 2021

(51) Int. Cl.
*H10B 43/35* (2023.01)
*H10B 43/27* (2023.01)
(Continued)

(52) U.S. Cl.
CPC ............. *H10B 43/27* (2023.02); *H10B 41/27* (2023.02); *H10B 41/35* (2023.02); *H10B 43/35* (2023.02)

(58) Field of Classification Search
CPC ......... H01L 27/11582; H01L 27/11556; H01L 27/1157; H01L 27/11565; H01L 27/11578; H01L 27/11519; H01L 29/40117; H01L 29/7926; H01L 29/7889; H01L 29/66833; H01L 27/11551; H01L 29/66666; H01L 27/11529; H01L 23/528; H01L 27/11568; H01L 27/11524; H10B 43/27; H10B 43/35; H10B 41/35; H10B 41/27

USPC ........ 257/314, 315, 319, 321, 324, E21.179, 257/E21.18, E29.255, E29.3 E, 29.309; 438/257, 264, 268, 591, 593, 594
See application file for complete search history.

(56) References Cited

U.S. PATENT DOCUMENTS 9,159,739 B2 10/2015 Makala et al.
9,524,779 B2 12/2016 Kai et al.
(Continued)

FOREIGN PATENT DOCUMENTS

CN 109841571 A 6/2019
WO 2019/036292 A1 2/2019

OTHER PUBLICATIONS

Chinese First Office Action for Chinese Application No. 202010807945. X, dated Aug. 7, 2023, 18 pages with translation.

*Primary Examiner* — David Chen
(74) *Attorney, Agent, or Firm* — TraskBritt

(57) ABSTRACT

Electronic devices (e.g., semiconductor devices, which may be configured for 3D NAND memory devices), comprise pillars extending through a stack of alternating conductive tiers and insulative tiers. The conductive tiers, which may include control gates for access lines (e.g., word lines), include conductive rails along an outer sidewall of the conductive tiers, distal from the pillars extending through the conductive tiers. The conductive rails protrude laterally beyond outer sidewalls of the insulative tiers. The conductive rails increase the amount of conductive material that may otherwise be in the conductive tiers, which may enable the conductive material to exhibit a lower electrical resistance, improving operational performance of the electronic devices.

24 Claims, 15 Drawing Sheets

(51) Int. Cl.
*H10B 41/27* (2023.01)
*H10B 41/35* (2023.01)

(56) References Cited

U.S. PATENT DOCUMENTS

| | | | |
|---|---|---|---|
| 10,529,620 B2 * | 1/2020 | Sharangpani | H01L 27/11529 |
| 10,559,588 B2 * | 2/2020 | Dong | G11C 16/0483 |
| 2010/0248473 A1 * | 9/2010 | Ishizaka | H01L 21/76883 |
| | | | 257/E21.582 |
| 2013/0168752 A1 * | 7/2013 | Kim | H01L 27/11582 |
| | | | 257/314 |
| 2013/0168757 A1 | 7/2013 | Hong | |
| 2016/0104719 A1 * | 4/2016 | Jung | H01L 27/11578 |
| | | | 257/324 |
| 2016/0351582 A1 * | 12/2016 | Kim | H10B 43/35 |
| 2017/0062472 A1 * | 3/2017 | Park | H01L 23/53257 |
| 2017/0148811 A1 | 5/2017 | Zhang et al. | |
| 2017/0352669 A1 * | 12/2017 | Sharangpani | H01L 23/53266 |
| 2017/0352671 A1 * | 12/2017 | Kato | H01L 29/512 |
| 2018/0138193 A1 * | 5/2018 | Zhang | H01L 27/11556 |
| 2019/0164762 A1 * | 5/2019 | Su | H01L 21/28079 |
| 2020/0091176 A1 * | 3/2020 | Yun | H01L 21/0217 |

* cited by examiner

THREE-DIMENSIONAL MEMORY WITH CONDUCTIVE RAILS IN CONDUCTIVE TIERS, AND RELATED APPARATUS, SYSTEMS, AND METHODS

TECHNICAL FIELD

The disclosure, in various embodiments, relates generally to apparatus (e.g., devices, systems) with vertical arrays of memory devices that include interleaving insulative and conductive tiers. More particularly, this disclosure relates to apparatus (e.g., semiconductor storage devices (e.g., 3D NAND memory devices)) having, and methods for forming, conductive "rails" extending from conductive material of conductive tiers of the stack.

BACKGROUND

Memory provides data storage for electronic systems. Flash memory is one of various memory types and has numerous uses in modern computers and devices. A conventional flash memory device may include a memory array that has a large number of charge storage devices (e.g., memory cells, such as, non-volatile memory cells) arranged in rows and columns. In a NAND architecture type of flash memory, storage devices arranged in a column are coupled in series, and the first storage device of the column is coupled to a data line (e.g., a bit line).

In "three-dimensional NAND" (which may also be referred to herein as "3D NAND"), a type of vertical memory, not only are the storage devices arranged in row and column fashion in a horizontal array, but tiers of the horizontal arrays are stacked over one another (e.g., as vertical strings of storage devices) to provide a "three-dimensional array" of the storage devices. The stack of vertical tiers alternate conductive materials with insulating (e.g., dielectric) materials. Pillars, which may each provide a vertical channel region, extend through the stack. A drain end of a string is adjacent one of the top and bottom of the pillar, while a source end of the string is adjacent the other of the top and bottom of the pillar. The drain end is operably connected to a bit line, while the source end is operably connected to a source line.

The conductive materials of the vertical stack form conductive regions, which may serve different functions. Some of the conductive regions may be operable as control gates for access lines (e.g., word lines) of the memory devices, while others of the conductive regions may, for example, be operable as control gates for select gate devices (e.g., transistors) (which may be otherwise referred to herein as "select gates"), as "dummy" control gates (e.g., "dummy" access lines), as gate-induced drain leakage (GIDL) generators, or other functions.

One factor contributing to the operational characteristics of electric apparatus (e.g., devices, systems) that include 3D NAND structures is the electrical resistance exhibited by the conductive materials of the conductive regions of the vertical stack. Designing and fabricating 3D NAND structures for electric apparatus with conductive regions exhibiting sufficiently low electrical resistance remains challenging.

DETAILED DESCRIPTION

Figure 1:
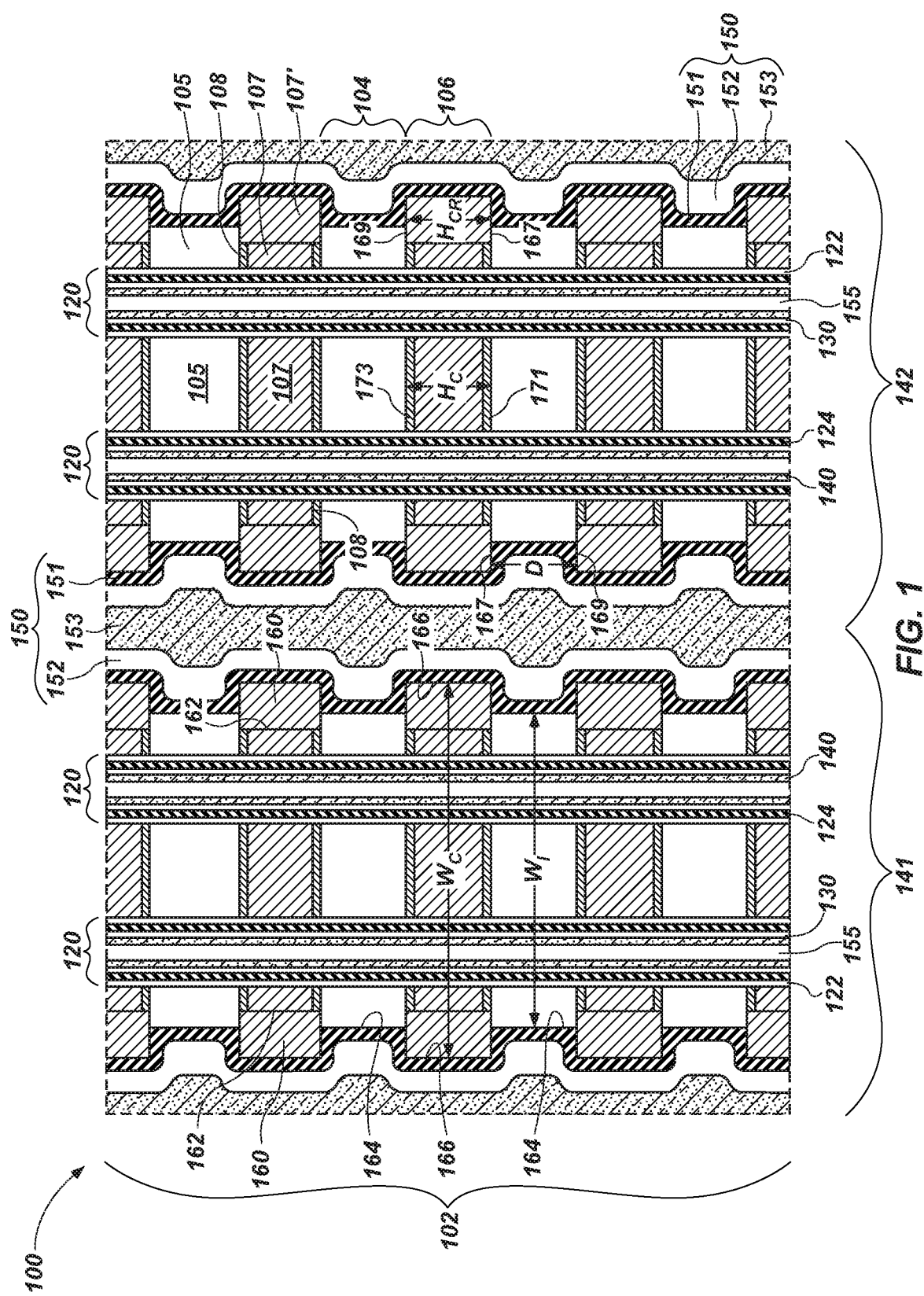
FIG. 1 is a cross-sectional, elevational, schematic illustration of a structure for an array of storage devices with a 3D NAND architecture, according to embodiments of the disclosure, wherein conductive rails, on conductive tiers of a stack, have upper and lower surfaces coplanar with the upper and lower surfaces of the conductive tiers from which they extend.

Apparatus (e.g., devices, systems) and the structures thereof, according to embodiments of the disclosure, include a stack of vertically alternating conductive material tiers and insulative material tiers with pillars extending through the stack. So-called "rails" of conductive material extend from the conductive material tiers, effectively increasing the amount of the conductive material in the conductive material tiers. The increased amount of the conductive material enables a lower electrical resistance to be exhibited by conductive regions (e.g., control gates for access lines) of the apparatus.

As used herein, the term "stack" means and includes a structure with "insulative tiers" interleaved, one above the other, with "conductive tiers." As used herein, the term "insulative tier" means and refers to a level, in a stack, that comprises insulative (e.g., dielectric) material. As used herein, the term "conductive tier" means a level, in the stack, that comprises, at least in a completed structure, conductive material of an access line and which conductive tier is disposed vertically between a pair of insulative tiers, e.g., with one insulative tier below and one insulative tier above.

As used herein, the term "rail" means and includes a segment of a material exhibiting an identified property, which segment extends from a larger segment material of the identified property. For example, a "conductive rail," means and includes a segment of a conductive material extending from a larger segment of a conductive material, whether of the same conductive material or of another conductive material.

As used herein, the term "opening" means a volume extending into or through another region or material, or between regions or materials, leaving a gap in that other region or material, or between regions or materials. Unless otherwise described, an "opening" is not necessarily empty of material. That is, an "opening" is not necessarily void space. An "opening" formed in a region or material may comprise regions or material other than that in which the opening is formed. And, a region or material "exposed" within an opening is not necessarily in contact with an atmosphere or non-solid environment. A region or material "exposed" within an opening may be in contact with or adjacent another region or material that is disposed within the opening.

As used herein, the term "air gap" means a volume extending into or through another region or material, or between regions or materials, leaving a gap in that other region or material, or between regions or materials, that is empty of solid and liquid material. Unless otherwise described, an "air gap" is not necessarily empty of gaseous material and not necessarily containing "air." An "air gap" may be, but is not necessarily, void space.

As used herein, the term "sacrificial material" means and includes a material that is formed during a fabrication process but which is subsequently removed, prior to completion of the fabrication process.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOT") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the terms "horizontal" or "lateral" mean and include a direction that is parallel to a primary surface of the substrate on which the referenced material or structure is located. The "width" and "length" of a respective region or material may be defined as dimensions in a horizontal plane.

As used herein, the terms "vertical" or "longitudinal" mean and include a direction that is perpendicular to a primary surface of the substrate on which a referenced material or structure is located. The "height" of a respective region or material may be defined as a dimension in a vertical plane.

As used herein, the terms "inner" and "outer" are relative terms indicating a disposition relative to a longitudinal axis of a structure. Materials, regions, and sub-regions nearest the longitudinal axis may be construed as "inner" or "inward" relative to other materials, regions, and sub-regions further from the longitudinal axis, which other materials, regions, and sub-regions may be construed as "outer" or "outward" relative to the inner or inward materials, regions, and sub-regions.

As used herein, the terms "thickness" or "thinness" mean and include a dimension in a straight-line direction that is normal to the closest surface of an immediately adjacent material or region that is of a different composition or that is otherwise distinguishable from the material or region whose thickness or thinness is discussed.

As used herein, the term "between" is a spatially relative term used to describe the relative disposition of one material, region, or sub-region relative to at least two other materials, regions, or sub-regions. The term "between" may encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate" is a spatially relative term used to describe disposition of one material, region, or sub-region near to another material, region, or sub-region. The term "proximate" includes dispositions of indirectly adjacent to, directly adjacent to, and internal to.

As used herein, the term "neighboring," when referring to a material or region, means and refers to a next, most proximate material or region of an identified composition or characteristic. Materials or regions of other compositions or characteristics than the identified composition or characteristic may be disposed between one material or region and its "neighboring" material or region of the identified composition or characteristic. For example, a region of material X "neighboring" a region of material Y is the first material X region, e.g., of multiple material X regions, that is next most proximate to the particular region of material Y. The "neighboring" material or region may be directly or indirectly proximate the region or material of the identified composition or characteristic.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the term "elevation" is a spatially relative term used for each of description to describe one element's or feature's relationship to another element(s) or feature(s) as illustrated in the figures, using—as a reference point—the primary surface of the substrate on which the reference material or structure is located. As used herein, an "elevation" is defined by a horizontal plane parallel to the primary surface. "Lower elevations" are nearer to the primary surface of the substrate, while "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprises," "comprising," "includes," and/or "including" specify the presence of stated features, regions, stages, operations, elements, materials, components, and/or groups, but do not preclude the presence or addition of one or more other features, regions, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

As used herein, the terms "memory device," "memory structure," and "memory" mean and include apparatus exhibiting, but not limited to, a memory function. For example, a "memory device" may include a system on a chip (SoC) or a semiconductor die including memory with a processing in memory (PIM) function.

The illustrations presented herein are not meant to be actual views of any particular material, structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but may include deviations in shapes that result, for example, from manufacturing techniques. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

Reference will now be made to the drawings, where like numerals refer to like components throughout. The drawings are not necessarily drawn to scale.

FIG. 1 illustrates a structure 100, according to embodiments of the disclosure, for an apparatus (e.g., for an array of storage devices with a 3D NAND architecture). The structure 100 may be included in any of a variety of electronic apparatus, such as a memory device, an integrated circuit, or other apparatus that includes one or more cells to store charge. The structure 100 includes a stack 102 of vertically alternating material tiers. The stack 102 includes insulative tiers 104 interleaved with conductive tiers 106. The structure 100 of FIG. 1 does not necessarily illustrate the entire height of the stack 102, and there may or may not be additional insulative tiers 104 and/or conductive tiers 106 above or below the portion of the stack 102 illustrated in FIG. 1.

A data line (not illustrated) may underlay the stack 102, and the stack 102 may be supported by a base material (e.g., a substrate (e.g., polysilicon)) (not illustrated).

The insulative tiers 104 of the stack 102 comprise at least one insulative material 105 (e.g., a dielectric material (e.g., an oxide (e.g., silicon dioxide))). In some embodiments, all of the insulative material(s) 105 of the stack 102 may have the same composition. In other embodiments, the composition of the insulative material 105 may be different in some of the insulative tiers 104.

At least some of the conductive tiers 106 of the stack 102 may be configured as control gates for access lines (e.g., control gates for word lines), referred to herein generally as "access lines." In some embodiments, others of the conductive tiers 106 may be configured as one or more "dummy" regions (e.g., dummy access lines); one or more control gates for select gate devices (e.g., transistors) (e.g., for a select gate drain (SGD)); and/or gate-induced drain leakage (GIDL) generators.

The conductive tiers 106 comprise at least one conductive material. The conductive material of the conductive tiers 106 may comprise, consist essentially of, or consist of one or more of the following: conductive metal(s) (e.g., tungsten (W), molybdenum (Mo), cobalt (Co)), conductive metallic compound(s) (e.g., metallic silicide(s)), conductive nitride material(s) (e.g., titanium nitride), and conductive polysilicon materials. For example, the structure 100 may be configured as a 3D NAND structure with replacement gates (e.g., "RG NAND"), the conductive material of the conductive tiers 106 may comprise, comprise primarily, consist essentially of, or consist of conductive metals and/or conductive metallic compounds. In some such embodiments, such as that illustrated in FIG. 1, the structure 100 may be configured as 3D NAND with replacement gates, and the conductive tiers 106 may provide a conductive region (e.g., gate) with a conductive material 107 (e.g., tungsten) disposed on another conductive material 108 (e.g., conductive titanium nitride). As another example, the structure 100 may be configured as a 3D NAND structure with floating gates (e.g., "FG NAND"), and the conductive material of the conductive tiers 106 may comprise, comprise primarily, consist essentially of, or consist of conductive polysilicon materials, such that the illustrated conductive materials 107, 108 may both be conductive polysilicon material(s) (e.g., integrally formed, formed together) without visible distinction between the conductive materials 107, 108.

In some embodiments, all of the conductive material(s) (e.g., the conductive material 107 and the other conductive material 108) of the conductive tiers 106 of the stack 102 may have the same composition from one conductive tier 106 to another. In other embodiments, the composition of the conductive material(s) may be different in some of the conductive tiers 106.

Pillars 120 extends extend vertically through the stack 102. The pillar 120 includes materials concentrically about (e.g., around) a longitudinal axis of the pillar 120. From outside to inside, the pillar 120 may include a dielectric barrier 122 (e.g., comprising, consisting essentially of, or consisting of one or more dielectric materials (e.g., an oxide material (e.g., a silicon dioxide)) (e.g., a "control dielectric")), a charge trap region 124 (e.g., a storage node), a tunnel region 130 (e.g., one or more dielectric materials (e.g., a sub-region of an oxynitride (e.g., silicon oxynitride) between sub-regions of an oxide (e.g., silicon dioxide)), and a channel region 140 (e.g., a doped hollow channel (DHC) comprising, consisting essentially of, or consisting of a doped polysilicon)). The charge trap region 124 comprises a material formulated and configured to store charge received from the channel region 140 during operation of the apparatus (e.g., device (e.g., memory device), system) that includes the structure 100. The charge trap region 124 may comprise, consist essentially of, or consist of a dielectric nitride region (e.g., silicon nitride). The channel region 140 is operable to conduct a current from control gates (e.g., the conductive regions formed by the conductive materials (e.g., conductive material 107 and other conductive material 108) of the conductive tiers 106) in controlling the storage of charge in the charge trap region 124.

The pillars 120 may be arranged in groups (e.g., "blocks" (e.g., a first block 141, a second block 142, etc.)). Fill material(s) 150 may extend between the blocks (e.g., between the first block 141 and the second block 142). The fill material may include one or more insulative (e.g., dielectric) materials, such as a nitride material 151 (e.g., a silicon nitride), an oxide material 152 (e.g., a silicon oxide (e.g., silicon dioxide)), and polysilicon 153.

One or more other fill materials 155 may be included in the pillars 120 to fill or partially fill a center of each of the pillars 120 (e.g., along the longitudinal axis of each of the pillars 120). The other fill material(s) 155 may comprise, consist essentially of, or consist of one or more dielectric materials (e.g., an oxide material (e.g., silicon dioxide)).

Conductive rails 160 extend from an outer sidewall 162 of the conductive material 107 (or of the conductive material 107 and the other conductive material 108), past an outer sidewall 164 of the insulative material 105 of the insulative tiers 104 above and/or below. The conductive rails 160 may comprise, consist essentially of, or consist of the conductive material 107.

The conductive rails 160 may extend directly from—and be in direct physical contact with—the conductive material 107 of the conductive tiers. In some embodiments, one or more intermediate materials (e.g., seed materials, other formation-promoting materials) may be disposed between the conductive rails 160 and the conductive material 107, or between the conductive rails 160 and both the conductive material 107 and the other conductive material 108.

The presence of the conductive rails 160 effectively increases the amount of the conductive material 107 present in the conductive tiers 106, compared to conductive tiers lacking the conductive rails, without necessitating an increase in the horizontal footprint of the conductive tiers 106 or the blocks (e.g., the first block 141, the second block 142, etc.). The increased amount of conductive material 107 enables a lower electrical resistance of the conductive material 107 in each respective conductive tier 106. In some embodiments, the electrical resistance exhibited by the conductive material 107 may be from about 1% to about 50%, or even a higher percentage, less than the electrical resistance of conductive material of a conventional conductive tier of a 3D NAND structure. For example, where a conventional conductive tier may exhibit an electrical resistance of about 13Ω·µm, the conductive tiers of the structures of the embodiments of the disclosure may exhibit an electrical resistance of about 5Ω·µm. The lower electrical resistance may be achieved without necessitating an increase to the pitch or critical dimension (CD) of the pillars 120. Correspondingly, suitable (e.g., lower) electrical resistance levels may be achieved, even while the pitch or CD of the pillars 120 continue to be scaled down to smaller values.

With the conductive rails 160 extending laterally beyond the insulative material 105, a maximum width $W_C$ defined by outer sidewalls 166 of the conductive rails 160—which outer sidewalls 166 may also be characterized as outer sidewalls 166 of the conductive tiers 106—is greater than a maximum width $W_1$ defined by the outer sidewalls 164 of the insulative tiers 104. Notably, as used herein, the "outer" sidewalls 162, 164, 166 are the sidewalls proximate the sidewalls of a respective one of the blocks (e.g., the first block 141, the second block 142), opposite sidewalls proximate the pillars 120. The "outer" sidewalls 162, 164, 166 are adjacent the fill materials 150. In some embodiments, the "outer" sidewalls 162, 164, 166 are in direct contact with an innermost material (e.g., the nitride material 151) of the fill materials 150.

Thus, the conductive rails 160 extend from the conductive material 107, away from the pillars 120, such that the stack 102 includes conductive tiers 106 (including the conductive rails 160) that are laterally wider than the insulative tiers 104 of the stack 102.

Each of the conductive rails 160 is separated (e.g., spaced) from neighboring conductive rail(s) 160 (e.g., the conductive rail(s) 160 above and/or below) a separation distance D that is sufficient to ensure the conductive rails 160 of each conductive tier 106 are electrically isolated from the conductive rails 160 of other conductive tiers 106. Separation distance D is defined by the dimension separating a lower surface 167 of one of the conductive rails 160 from an upper surface 169 of a neighboring one of the conductive rails 160.

In some embodiments, the separation distance D between each neighboring pair of the conductive rails 160 may be about equal along the stack 102. In other embodiments, the separation distance D may vary at different elevations of the stack 102, provided each neighboring pair of the conductive rails 160 is electrically isolated from one another.

In some embodiments, and with respect to a particular conductive tier 106, the conductive rail 160 may have a same height $H_{CR}$ (defined as a dimension between the lowest elevation of the lower surface 167 and the highest elevation of the upper surface 169) as a height $H_C$ of the remainder of the conductive tier 106 (e.g., defined as a dimension between the lowest elevation of a lower surface 171 and the highest elevation of an upper surface 173 of the remainder of conductive material (e.g., the conductive material 107 and the other conductive material 108) of the conductive tier 106.

While the structure 100 of FIG. 1 includes conductive tiers 106 with upper and lower surfaces that are substantially or wholly planar—e.g., the lower surface 167 of the conductive rail 160 is coplanar with the lower surface 171 of the non-rail remainder of the conductive tier 106, while the upper surface 169 of the conductive rail 160 is coplanar with the upper surface 173 of the non-rail remainder of the conductive tier 106—in other embodiments, the conductive tiers 106 may be otherwise structured but still include an increased amount of the conductive material 107.

As used herein, the "non-rail remainder of the conductive tier" means that portion of the conductive tier 106 that is other than the conductive rail 160 portion. The non-rail remainder of the conductive tier includes the conductive material 107 and, if present, the other conductive material 108. The lower surface 171 and the upper surface 173 of the non-rail remainder of the conductive tier 106 may be defined by the conductive material 107, in conductive tiers consisting of the conductive material 107, or by the other conductive material 108, in conductive tiers 106 comprising both the conductive material 107 and the other conductive material 108, as in the structure 100 of FIG. 1, and in other embodiments of the disclosure.

Figure 2:
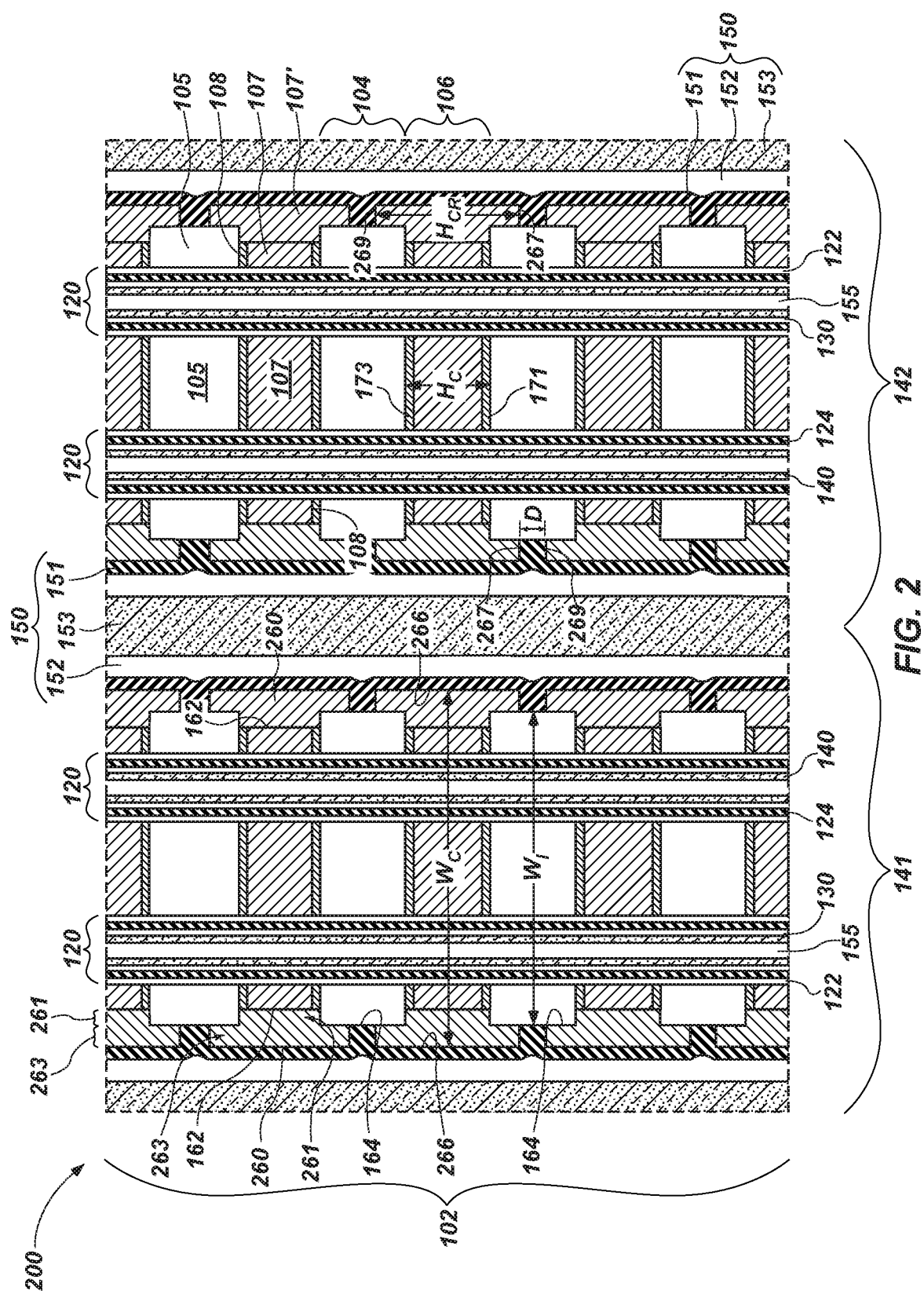
FIG. 2 is a cross-sectional, elevational, schematic illustration of a structure for an array of storage devices with a 3D NAND architecture, according to embodiments of the disclosure, wherein conductive rails, on conductive tiers of a stack, define a "T" shape.

With reference to FIG. 2, a structure 200 (which may be operable in the same manner as the structure 100 of FIG. 1 and include the same materials, regions, and features as the structure 100 of FIG. 1, except as otherwise described herein) includes conductive rails 260 that are characterized herein as "T-shaped." These conductive rails 260 includes a first portion 261—vertically between the insulative material 105 of vertically neighboring insulative tiers 104—that has a height equal to the height $H_C$ of the conductive materials 107, 108 of the non-rail remainder of the conductive tier 106. The conductive rails 260 include a second portion 263—laterally beyond the outer sidewall 164 of the insulative material 105 of the insulative tiers 104—that defines the height $H_{CR}$ (defined as the dimension between the lowest elevation of a lower surface 267 and the highest elevation of an upper surface 269), which, in this embodiment, is greater than the height $H_C$ of the conductive materials 107, 108 of the non-rail remainder of the conductive tier 106. Therefore, the conductive rails 260, being T-shaped, extend vertically into elevations of the insulative tiers 104, and the second portion 263 may partially surround (e.g., laterally surround) a portion of the insulative material 105 of the insulative tiers 104. Such conductive rails 260 each define a lesser height at an inner portion, proximate the pillars 120, than at outer portions, distal from the pillars 120.

Opposing lower and upper surfaces 267, 269 of neighboring conductive rails 260 are again separated (e.g., spaced) by the separation distance D sufficient to ensure electrical isolation. The separation distances D may be tailored to the minimum distance that achieves electrical isolation, and enabling the greatest amount of conductive material contributed by the conductive rail 260 to the overall amount of conductive material (including conductive materials 107, 108) within the conductive tier 106.

Figure 3:
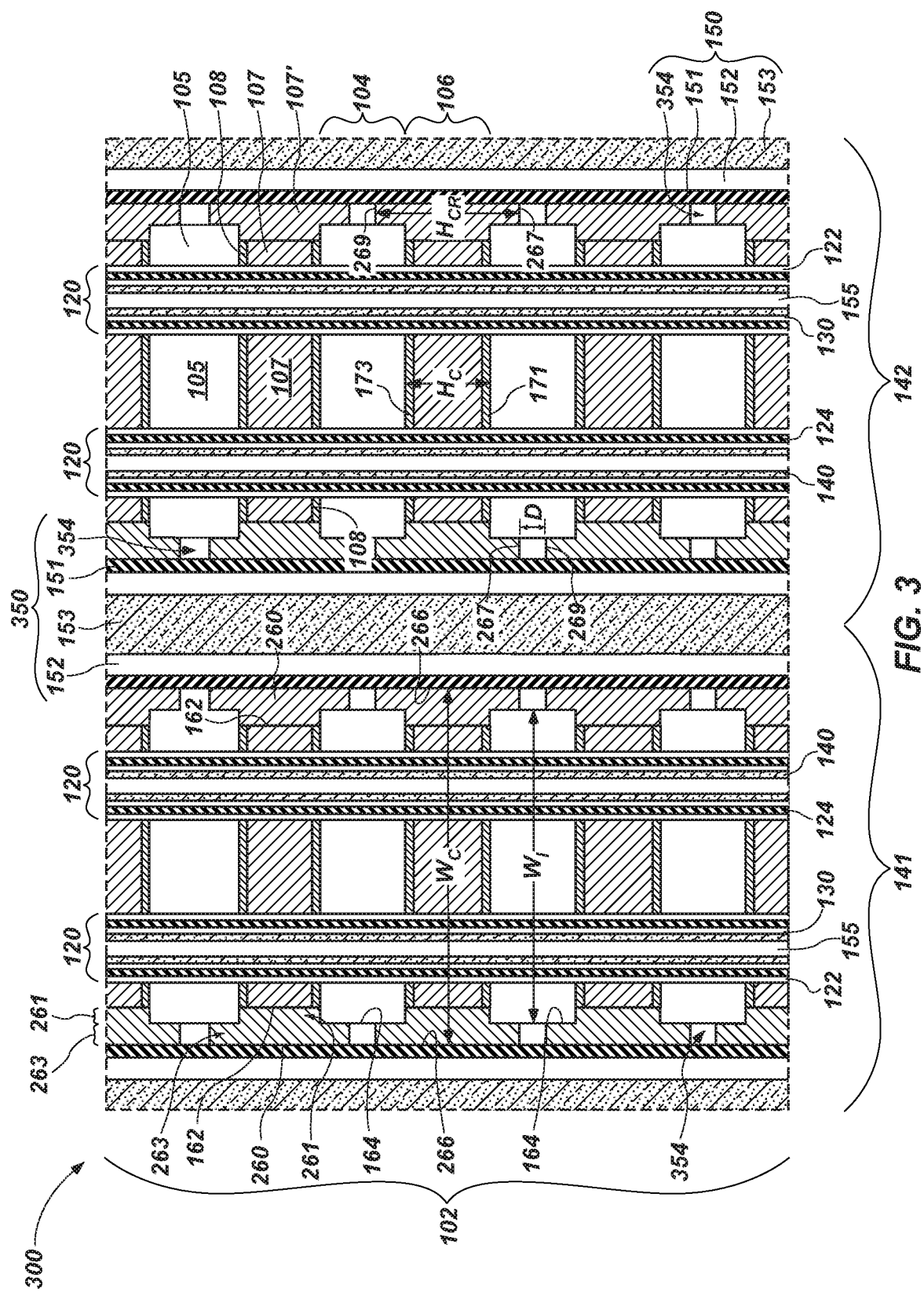
FIG. 3 is a cross-sectional, elevational, schematic illustration of a structure for an array of storage devices with a 3D NAND architecture, according to embodiments of the disclosure, wherein conductive rails, on conductive tiers of a stack, define a "T" shape, and wherein air gaps are defined in insulative fill material adjacent the T-shaped conductive rails.

While the fill material 150 of the structures 100, 200 of FIGS. 1 and 2, respectively, are conformally formed to one another to substantially or wholly fill, with solid material, the volume between neighboring blocks (e.g., the first block 141 and the second block 142), in other embodiments—such as that illustrated in FIG. 3—a structure 300 (which may be operable in the same manner as the structures 100 (FIG. 1) or 200 (FIG. 2) and include the same materials, regions, and features as the structures 100 (FIG. 1) or 200 (FIG. 2), except as otherwise described herein)—may have fill material 350 that includes one or more air gaps 354 in addition to other materials (e.g., the nitride material 151, the oxide material 152, the polysilicon 153). The air gaps 354 may be at the narrowest spaces between neighboring conductive rails (e.g., conductive rails 260), such as in the space defining the separation distance D. The presence of the air gaps 354 may further promote electrical isolation between neighboring conductive rails 260.

While FIG. 3 illustrates the structure 300 that includes both air gaps 354 and T-shaped conductive rails 260, the air gaps 354 may be included in other structures in which conductive rails are other than T-shaped.

Figure 4:
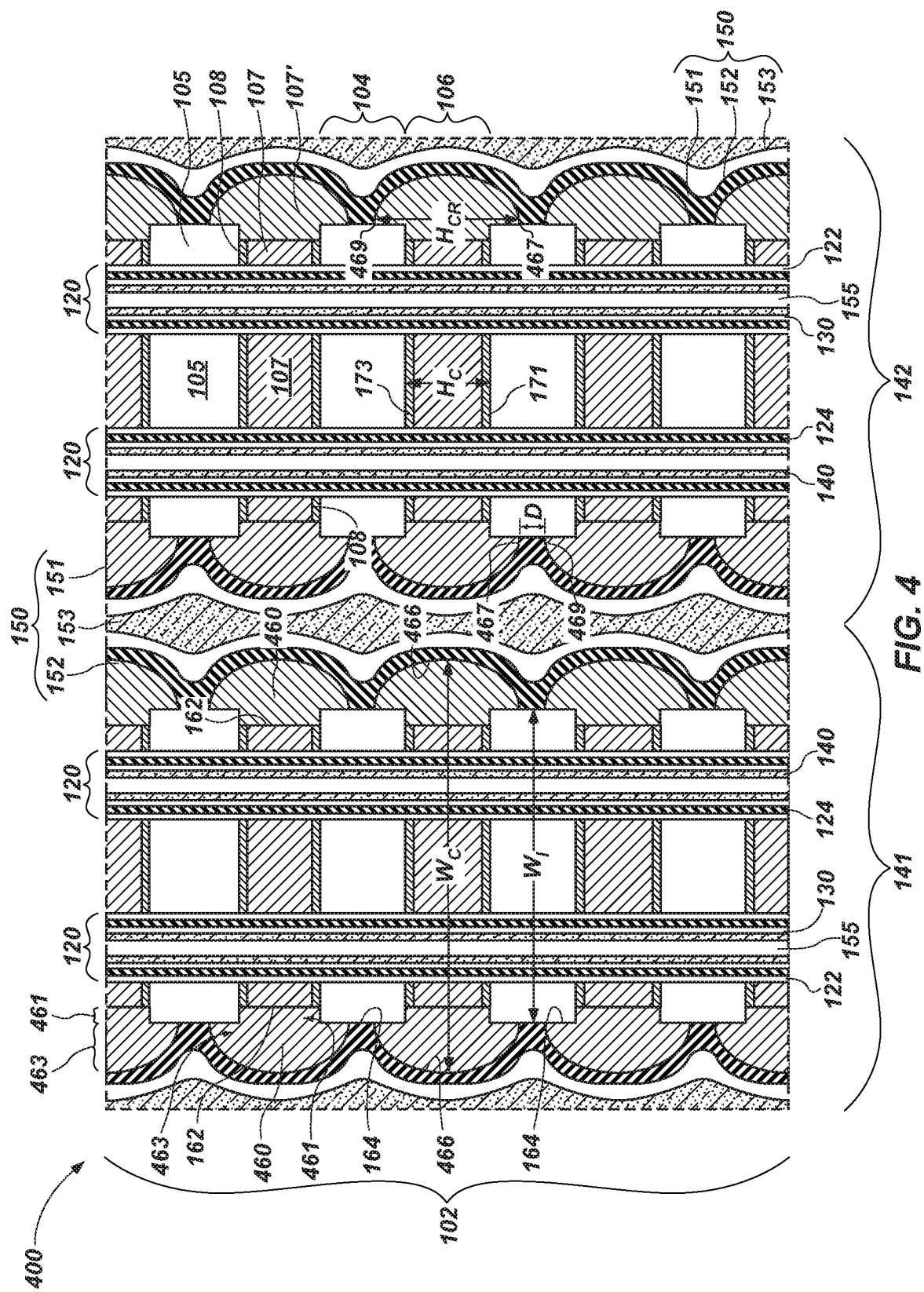
FIG. 4 is a cross-sectional, elevational, schematic illustration of a structure for an array of storage devices with a 3D NAND architecture, according to embodiments of the disclosure, wherein conductive rails, on conductive tiers of a stack, define a "mushroom" shape.
Figure 5:
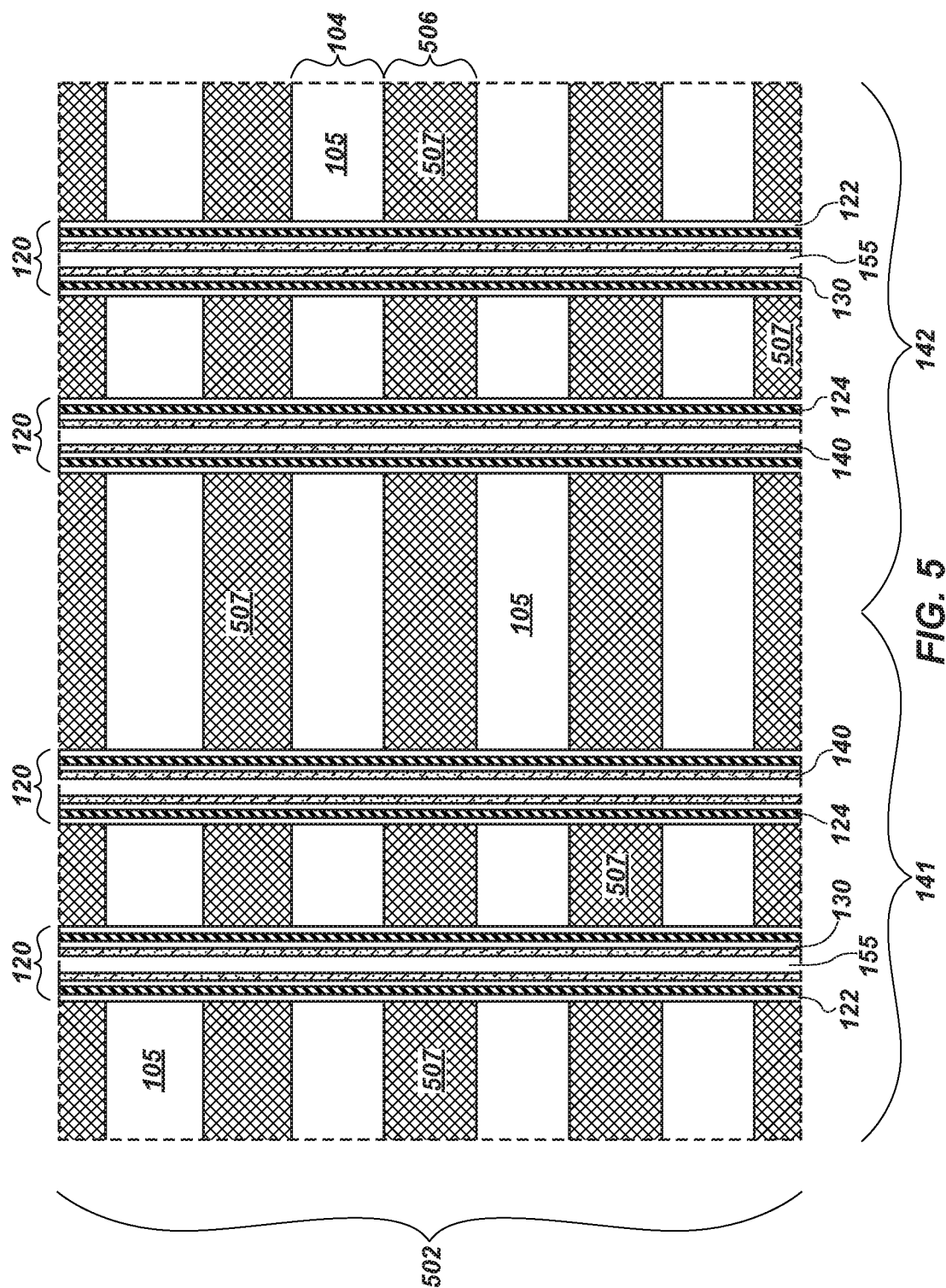
FIGS. 5 through 10 are cross-sectional, elevational, schematic illustrations during various stages of processing to fabricate the structure of FIG. 1, according to embodiments of the disclosure.
Figure 6:
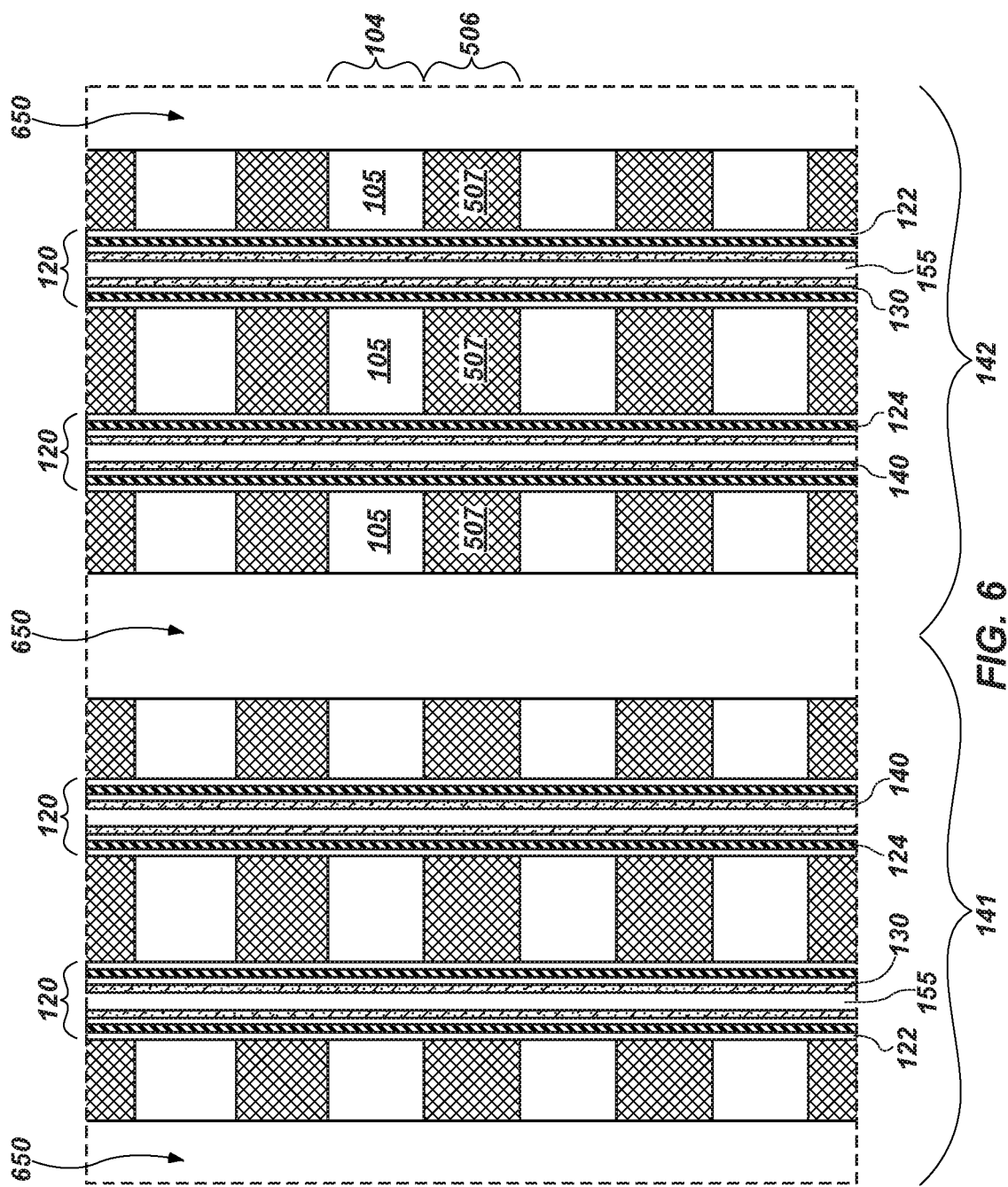

While the outer sidewall 166 (FIG. 1), 266 (FIGS. 2 and 3) of the conductive rails 160 (FIG. 1), 260 (FIGS. 2 and 3) may, in some embodiments, be substantially vertical (e.g., cylindrical), in other embodiments—such as that of FIG. 4—a structure 400 (which may be operable in the same manner as the structures 100 (FIG. 1), 200 (FIG. 2), or 300 (FIG. 3) and include the same materials, regions, and features as the structures 100 (FIG. 1), 200 (FIG. 2), or 300 (FIG. 3) except as otherwise described herein) may include conductive rails 460 with an outer sidewall 466 that curves through various elevations. The outer sidewall 466 may curve outward (e.g., away from a neighboring pillar 120) and then curve inward (e.g., toward the neighboring pillar 120) through the elevations of the outer sidewall 466, from bottom to top, such that the outer sidewall 466 may be convex (e.g., "vertically convex," a "vertically-convex" sidewall).

The conductive rails 460 with vertically-convex outer sidewalls 466 may also be "T-shaped" in that they have a first portion 461 proximate the pillars 120, which first portion 461 has a lesser height (e.g., dimension in a vertical direction) than a second portion 463 distal from the pillars 120. Because of the vertically-convex outer sidewalls 466 the conductive rails 460 may also be characterized as "mushroom-shaped," with the first portion 461 defining a "stem" portion of the mushroom shape and the second portion 463 defining a "cap" portion of the mushroom shape. The first portion 461 is vertically between the insulative material 105 of vertically neighboring insulative tiers 104 and has the height $H_C$ of the conductive materials 107, 108 of the non-rail remainder of the conductive tier 106. The second portion 463 is laterally beyond the outer sidewall 164 of the insulative material 105 of the insulative tiers 104 and defines the height $H_{CR}$ (defined as the dimension between the lowest elevation 467 reached by the outer sidewall 466 (e.g., the vertically-convex surface) and the highest elevation 469 reached by the outer sidewall 466 (e.g., the vertically-convex surface)). The height $H_{CR}$ is greater than the height $H_C$ of the conductive materials 107, 108 of the non-rail remainder of the conductive tier 106.

Accordingly, disclosed is an electronic apparatus comprising a stack of conductive tiers interleaved with insulative tiers of the stack. Pillars extend through the stack. Each of the pillars comprises a channel region. At least one conductive tier of the conductive tiers of the stack has a width greater than a width of vertically neighboring insulative tiers of the insulative tiers of the stack.

Also disclosed is a memory device comprising a stack of alternating insulative tiers and conductive tiers. Pillars extend through the stack. Each of the pillars comprises a channel region. At least one conductive tier of the conductive tiers comprises a region proximate a pillar of the pillars. The region comprises a conductive material. The at least one conductive tier of the conductive tiers also comprises a rail comprising the conductive material. The rail extends from the region proximate the pillar, away from the pillar, and beyond an outer sidewall of a neighboring insulative tier of the insulative tiers.

With reference to FIGS. 5 through 10, illustrated are various stages of a method of forming the structure 100 of FIG. 1. A material stack 502 of insulative material 105 vertically alternating with another material 507 may be formed (e.g., over a base material (e.g., a substrate, which may already support a conductive material for a bit line (not illustrated))) by forming (e.g., depositing) the materials thereof in sequence, one after the other, from lower-to-upper elevations. The insulative material 105 forms the insulative tiers 104, and the other material 507 form tiers 506 that will eventually become the conductive tiers 106 (FIG. 1).

In some embodiments, the other material 507 may be a sacrificial material and may comprise, e.g., a nitride (e.g., a silicon nitride). In other embodiments, the other material 507 may not be a sacrificial material but may be, for example, a conductive polysilicon material (e.g., for a final structure configured as 3D NAND with floating gates (e.g., FG NAND)).

An opening (e.g., a slit) may be formed (e.g., by a removal process (e.g., etching)) through the material stack 502 for each vertical string of storage devices that is to be formed. Each opening may be substantially cylindrical in shape (e.g., having a circular horizontal cross section) or some other shape that vertically extends through the material stack 502. Materials (e.g., cell materials) may be formed (e.g., conformally formed) on the sidewalls defining the opening, from outward to inward in succession. For example, the material of the dielectric barrier 122 may be formed (e.g., deposited) on (e.g., directly on) sidewalls of the insulative material 105 and the other material 507. The material of the charge trap region 124 may be formed (e.g., deposited) on (e.g., directly on) the dielectric barrier 122. The material or materials of the tunnel region 130 may be formed (e.g., deposited) directly on the charge trap region 124. The material of the channel region 140 (e.g., a polysilicon material) may then be formed on the material(s) of the tunnel region 130. The other fill material(s) 155 (e.g., polysilicon material with a dielectric plug atop the polysilicon material, adjacent an upper end of the pillars 120) may be formed on the material of the channel region 140.

In embodiments in which the other material 507 is a sacrificial material (e.g., a nitride material), subsequent processing may use conventional methods to remove the other material 507 in the material stack 502 and replace it with conductive material (e.g., the conductive material 107, and the other conductive material 108) to form the conductive tiers 106 (FIG. 1). For example, with reference to FIG. 6, openings 650 may be formed between each of the blocks (e.g., the first block 141, the second block 142) of the pillars 120. The other material 507 of each of tiers 506 is exposed in the openings 650. It should be noted that, because the pillars 120 have discrete horizontal cross-sections (e.g., circular cross-sections rather than elongate horizontal cross-sections), the portions of the insulative material 105 and the other material 507 illustrated as being between pillars 120 of the same block (e.g., between the two illustrated pillars 120 of the first block 141 or between the two illustrated pillars 120 of the second block 142) are not physically isolated portions of the insulative material 105 and the other material 507, respectively. Rather, the insulative material 105 of each respective block (e.g., first block 141, second block 142) and respective insulative tier 104 may be a continuous region with the pillars 120 of the respective block dispersed therein. Likewise for the other material 507 of each respective block and respective tier 506.

Figure 7:
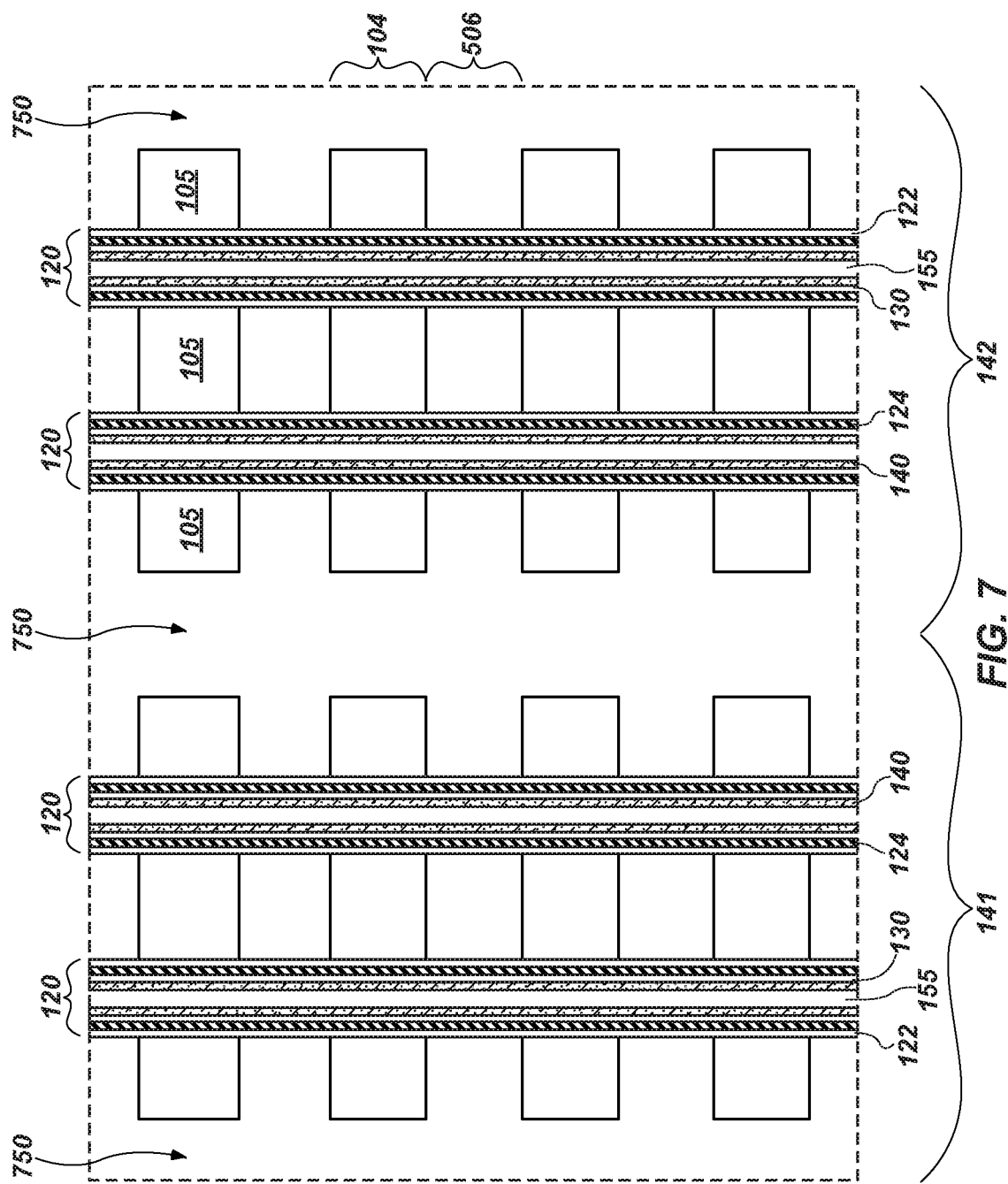
Figure 8:
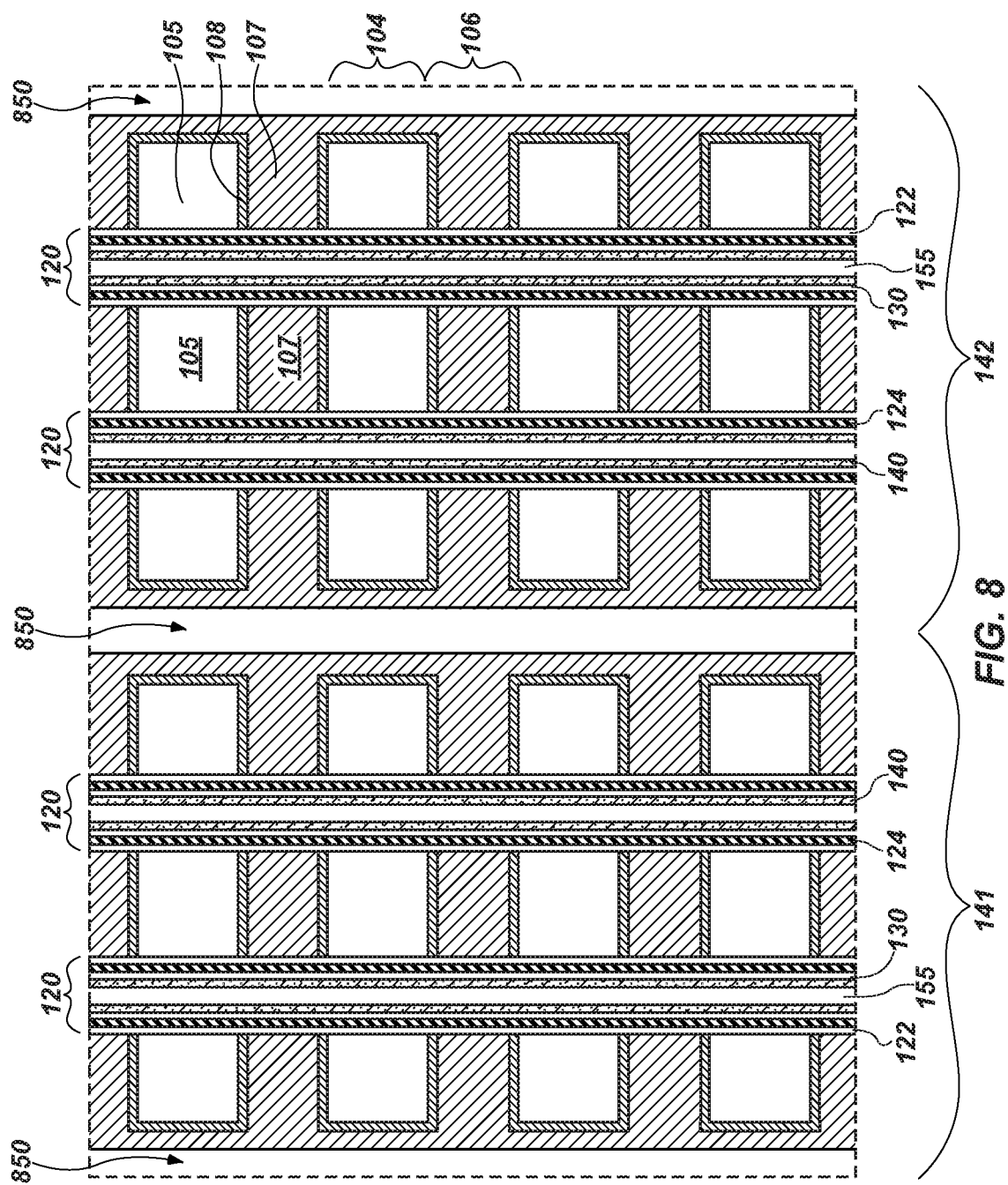

The other material 507, being exposed by the openings 650, may be removed (e.g., exhumed) without removing the insulative material 105, as illustrated in FIG. 7. Therefore, the openings 650 (FIG. 6) may be formed to a sufficient width and depth to enable full removal of the other material 507. This exhumation may be conducted as part of a so-called "replacement gate" process, which process may then include forming, via openings 750, the conductive materials of the non-rail portions of the conductive tiers 106 (FIG. 1). For example, as illustrated in FIG. 8, the other conductive material 108 (e.g., titanium nitride) may be formed adjacent (e.g., directly on) the insulative material 105, and the conductive material 107 (e.g., tungsten) may be formed adjacent (e.g., directly on) the other conductive material 108, leaving openings 850.

Figure 9:
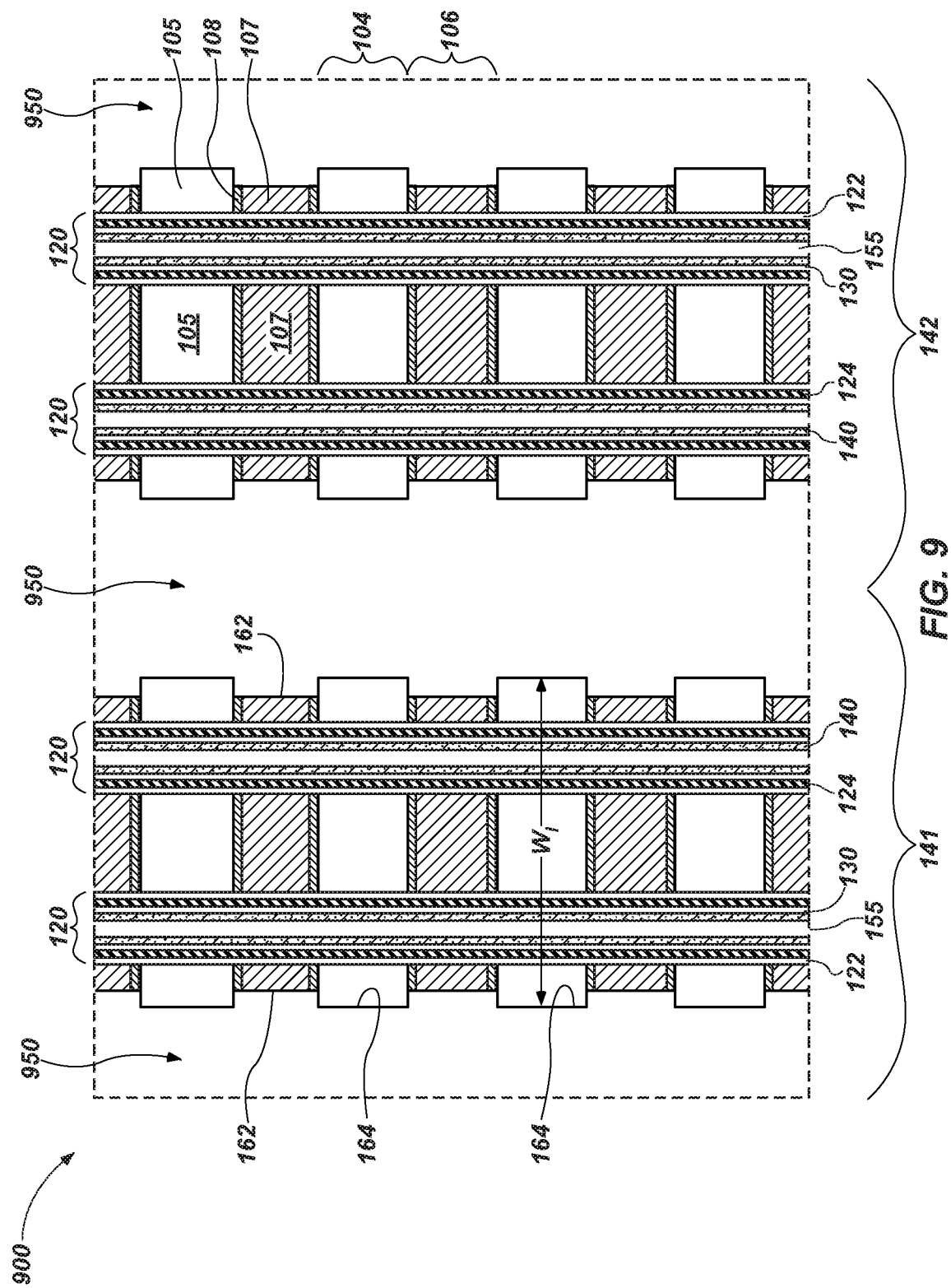

With reference to FIG. 9, another removal process (e.g., etching) may be performed to remove outermost portions of the conductive materials 107, 108 to ensure the conductive materials 107, 108 of each respective conductive tier 106 and block (e.g., the first block 141) are electrically isolated from the conductive materials 107, 108 of neighboring conductive tiers 106 and blocks (e.g., the second block 142), leaving openings 950 in intermediate structure 900. The width of the openings 950 may be tailored based, at least in part, on the grain size of the conductive materials 107, 108 to ensure no amount of the conductive materials 107, 108 bridges one of the openings 950 between blocks (e.g., between the first block 141 and the second block 142). In some embodiments, the openings 950 may be formed more widely than absolutely necessary to ensure sufficient electrical isolation between neighboring blocks. Forming the openings 950 may, in some embodiments, also remove some of the outermost portions of the insulative material 105, with the remaining amounts of the insulative material 105 having the width $W_1$ from opposite points of the sidewall 164. Forming the openings 950 results in the conductive materials 107, 108 being laterally recessed relative to the insulative material 105, such that the sidewall 162 of the conductive materials 107, 108 is nearer to a respective one of the pillars 120 than the sidewall 164 of the isolative insulative material 105 is to the pillar 120. The other conductive material 108 (if present) may, therefore, extend along only a portion of a width $W_1$ of neighboring insulative material 105 of neighboring insulative tiers 104.

Figure 10:
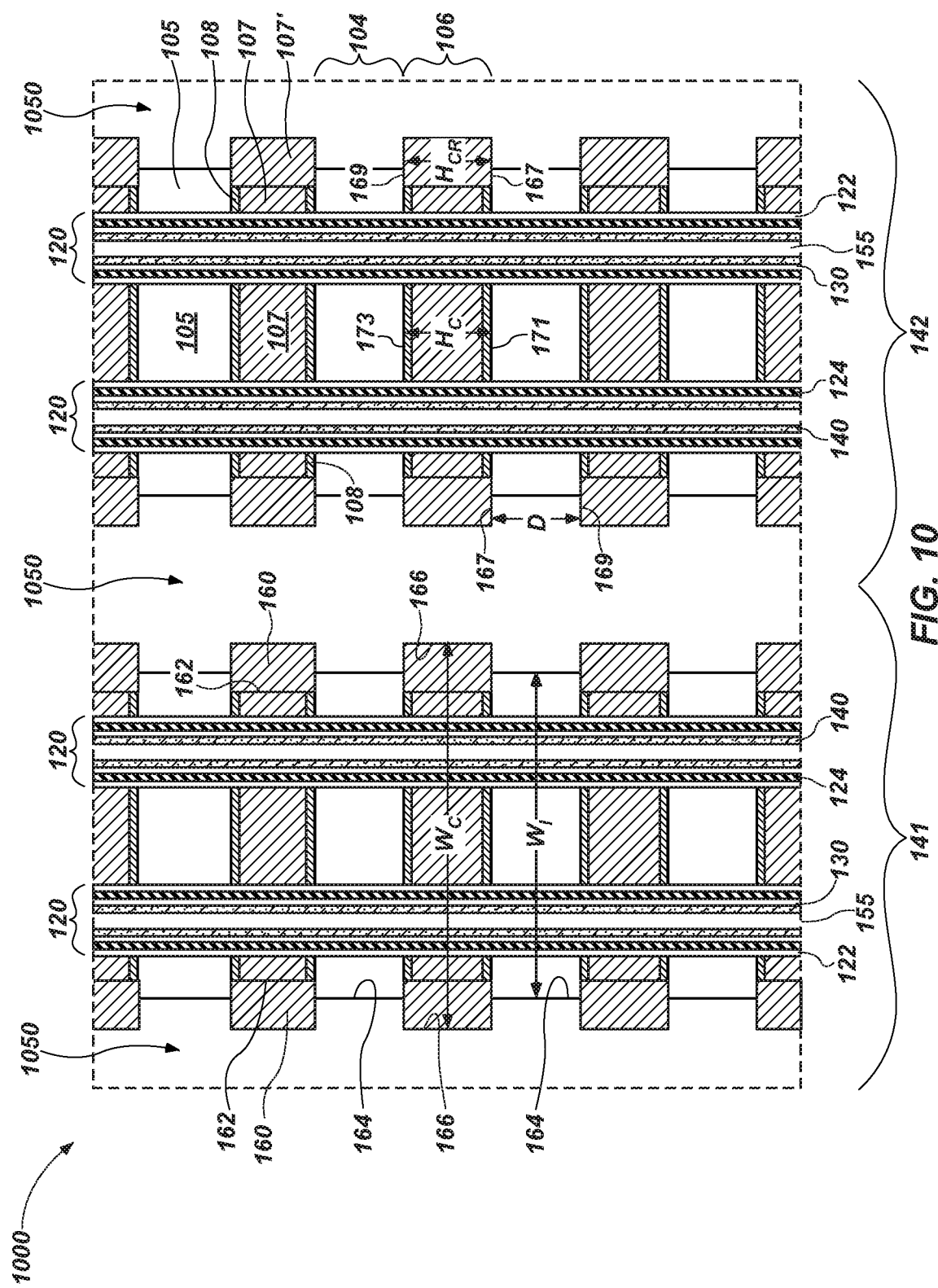

Because forming the openings 950 removes some of the conductive materials 107, 108, the electrical resistance exhibited by the conductive materials 107, 108 of the conductive tiers 106 of FIG. 9 may be greater than desired. To lower the electrical resistance, an additional amount of the conductive material (e.g., "additional conductive material" 107') is formed to extend (e.g., laterally extend) from each exposed portion of the conductive material 107 and, if present, the other conductive material 108. With reference to FIG. 10, then, the conductive rails 160 are formed (e.g., grown, deposited (e.g., by ALD, CVD, pulsed CVD, metal organic CVD, PVD)) adjacent (e.g., on, directly on) at least the conductive material 107.

The additional conductive material 107' may have the same composition as the conductive material 107. For example, both additional conductive material 107' of the conductive rails 160 and the conductive material 107 of the initially-formed replacement-gate material may comprise, consist essentially of, or consist of at least one of the conductive materials 107 discussed above, such as tungsten (W).

The additional conductive material 107' for the conductive rails 160 may be formed (e.g., deposited, grown) adjacent (e.g., on, directly on) the sidewall 162 of the conductive material 107 (and, if present, the other conductive material 108) remaining after forming the openings 950 of FIG. 9. In some embodiments, the additional conductive material 107' of the conductive rails 160 may comprise, consist essentially of, or consist of a material with the same composition as the conductive material 107, and the conductive material 107 may function as a seed material for the growth of the additional conductive material 107'.

The formation (e.g., deposition, growth) may be continued or repeated at least until the additional conductive material 107' extends laterally beyond the sidewalls 164 of the insulative material 105 of the insulative tiers 104. In embodiments in which the other conductive material 108 is present, the additional conductive material 107' also extends laterally beyond sidewalls (e.g., side ends) of the other conductive material 108. The formation (e.g., deposition, growth) of the additional conductive material 107' may be tailored to form as much of the additional conductive material 107' as wanted to lower the electrical resistance exhibited by the conductive tiers 106 without causing electrical shorting between vertically neighboring conductive tiers 106.

In some embodiments, such as that of FIG. 10, the additional conductive material 107' may be formed (e.g., deposited, grown) until it laterally extends beyond the sidewalls 164 of the insulative material 105 without vertically overlapping the sidewalls 164, forming intermediate structure 1000 with openings 1050 still providing electrical isolation between neighboring blocks (e.g., the first block 141, the second block 142). The fill materials 150 (FIG. 1) of the structure 100 of FIG. 1 may then be formed in the openings 1050, such as by forming (e.g., conformally forming) the nitride material 151 adjacent the sidewalls 166 of the conductive rails 160 (and, thus, of the conductive tiers 106) and adjacent the sidewalls 164 of the insulative tiers 104, forming (e.g., conformally forming) the oxide material 152 adjacent the nitride material 151, and forming (e.g., conformally forming) the polysilicon 153 adjacent the oxide material 152.

Figure 11:
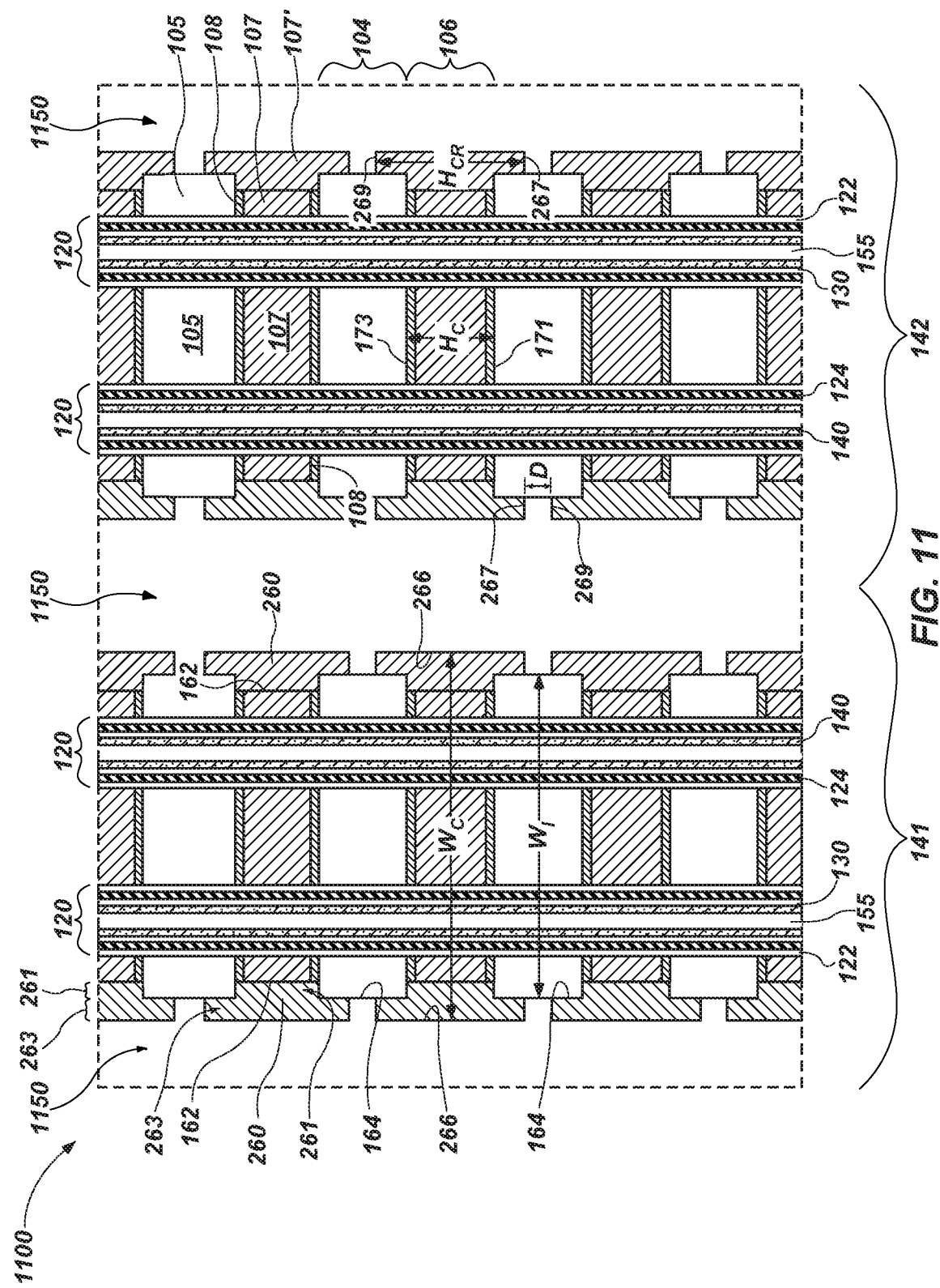
FIG. 11 along with FIGS. 5 through 9 are cross-sectional, elevational, schematic illustration during various stages of processing to fabricate the structures of FIG. 2 and FIG. 3, wherein the stage of FIG. 11 follows that of FIG. 9.

To form the conductive rails 260 of the structure 200 of FIG. 2, e.g., the T-shaped conductive rails 260, the formation of the additional conductive material 107' of FIG. 10 may be continued or repeated until the additional conductive material 107' extends vertically adjacent (e.g., at least partially overlaps) the sidewalls 164 of the insulative material 105, as illustrated in FIG. 11, forming the second portion 263. However, the formation of the additional conductive material 107' may be stopped before vertically adjacent portions of the additional conductive material 107' form close enough to one another as to form an electrical short between vertically neighboring conductive tiers 106. Thus, the separation distance D remains between the vertically adjacent portions of the additional material 107'. After forming the conductive rails 260, the fill materials 150 (FIGS. 2, 3) may be formed in openings 1150 of intermediate structure 1100 either wholly conformally, to form the structure 200 of FIG. 2, or partially conformally to leave the air gaps 354 (FIG. 3) vertically between the second portions 263 of the conductive rails 260 to form the structure 300 of FIG. 3.

Figure 12:
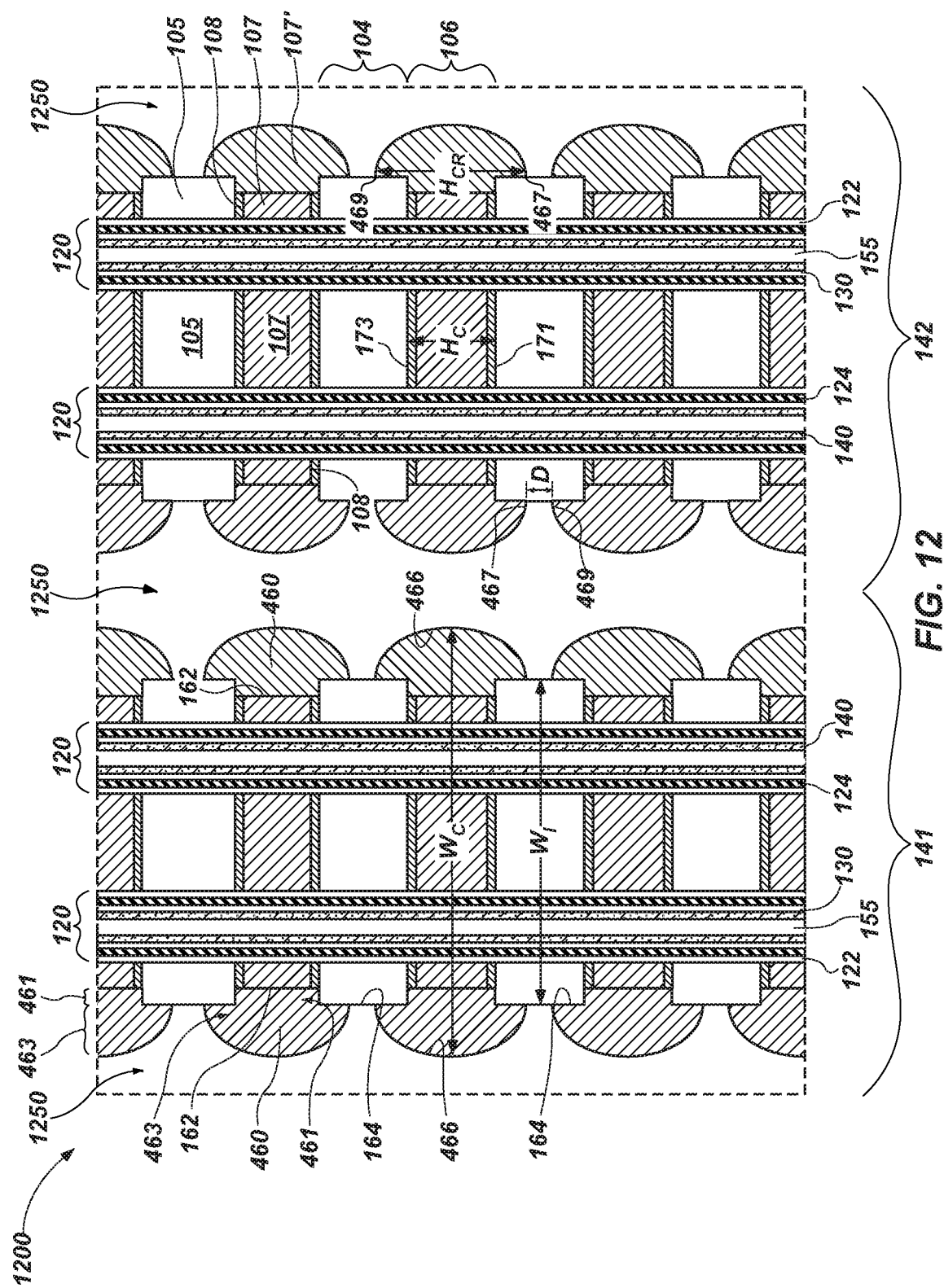
FIG. 12 along with FIGS. 5 through 9 are cross-sectional, elevational, schematic illustration during various stages of processing to fabricate the structure of FIG. 4, wherein the stage of FIG. 12 follows that of FIG. 9.

In some embodiments, such as that illustrated in FIG. 12, forming the additional conductive material 107' on the intermediate structure 900 of FIG. 9 may result in the additional conductive material 107' forming the outer sidewall 466 to a vertically-convex shape, such that the additional conductive material 107' forms the mushroom-shaped conductive rails 460 of the structure 400 of FIG. 4. The vertically-convex shape for the outer sidewall 466 may be the natural result of the formation (e.g., deposition, growth) process acts conducted. After forming the conductive rails 460, the fill materials 150 (FIG. 4) may be formed in openings 1250 of intermediate structure 1200 either wholly conformally, to form the structure 400 of FIG. 4, or partially conformally to leave air gaps (e.g., like the air gaps 354 of FIG. 3) vertically between the second portions 463 of the conductive rails 460.

Forming the conductive rails 160 (FIGS. 1 and 10), 260 (FIGS. 2, 3, and 11), 460 (FIGS. 4 and 12), according to embodiments of the disclosure, may comprise selectively forming (e.g., depositing (e.g., by ALD), growing) the additional conductive material 107' on the conductive material 107 (and, optionally, if present, the other conductive material 108). That is, the additional conductive material 107' may be formed in a manner that forms the additional conductive material 107' on at least the conductive material 107 without forming the additional conductive material 107' on the insulative material 105 at all (according to some embodiments) or in such a minimal amount that additional conductive material 107' formed on the insulative material 105 can be removed (e.g., etched) without wholly removing the additional conductive material 107' formed on the conductive material 107.

Figure 13:
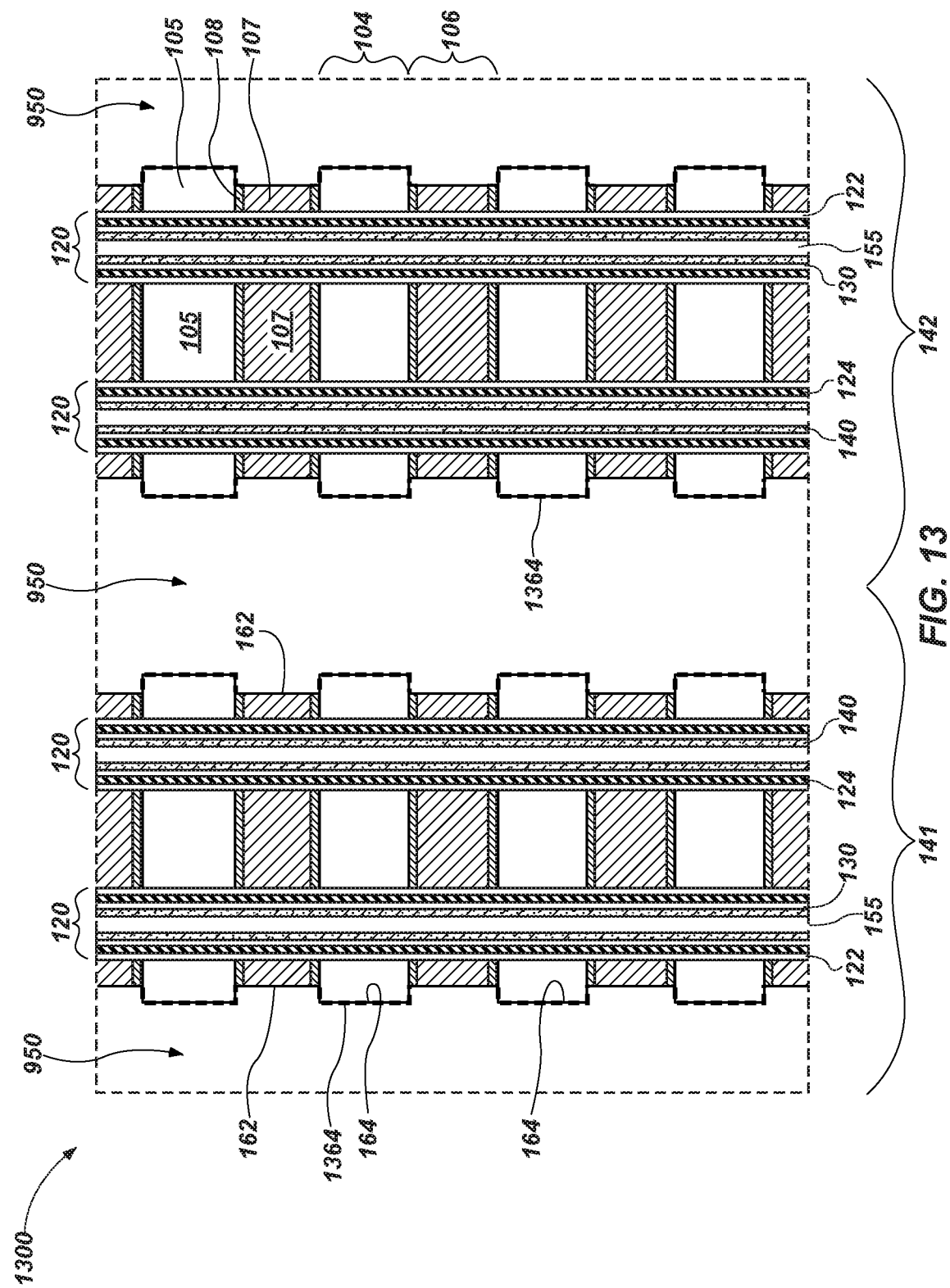
FIG. 13 is a cross-sectional, elevational, schematic illustration of a stage of processing to fabricate the structures of FIGS. 1 through 4, wherein the stage of FIG. 13 follows that of FIG. 9 (in the process to fabricate the structures of FIGS. 1 through 4) and precedes that of FIG. 10 in the process to fabricate the structure of FIG. 1, precedes that of FIG. 11 in the process to fabricate the structures of FIGS. 2 and 3, and precedes that of FIG. 12 in the process to fabricate the structure of FIG. 4.

In some embodiments, the selective formation of the additional conductive material 107' for the conductive rails 160 (FIGS. 1 and 10), 260 (FIGS. 2, 3, and 11), 460 (FIGS. 4 and 12) may be enabled or accommodated by pretreating the intermediate structure 900 of FIG. 9 before forming the additional conductive material 107'. In some such embodiments, and as that illustrated in FIG. 13, surfaces of the insulative material 105 exposed within the openings 950 of the intermediate structure 900 (FIG. 9) may be treated to inhibit formation of the additional conductive material 107' thereon. For example, an inhibitor 1364 may be formed (e.g., deposited) on at least the outer sidewall 164 and exposed portions of upper and lower surfaces of the insulative material 105, forming intermediate structure 1300 of FIG. 13. The inhibitor 1364 may be formulated to be selectively formable on the insulative material 105 and to inhibit formation (e.g., deposition, growth (e.g., nucleation)) of the additional conductive material 107' on the inhibitor 1364. The inhibitor 1364 may comprise, consist essentially of, or consist of an organic inhibitor (e.g., a polymer), which may be selectively formed on the insulative material 105 (e.g., a silicon dioxide). The inhibitor 1364 may be formulated to inhibit deposition, growth, adsorption, or absorption of the additional conductive material 107' during formation of the additional conductive material 107' on the conductive material 107 (and, if present, the other conductive material 108). The intermediate structure 1300 of FIG. 13 may then be subjected to the subsequent fabrication stages of FIG. 10, etc., to form the structure 100 of FIG. 1, to the subsequent stages of FIG. 11, etc., to form the structure 200 of FIG. 2 or the structure 300 of FIG. 3, or to the subsequent stages of FIG. 12, etc., to form the structure 400 of FIG. 4. Accordingly, the structures 100, 200, 300, and 400 of FIGS. 1 through 4, respectively, may also include the inhibitor 1364 on the outer sidewalls 164 of the insulative material 105, between the insulative material 105 and the fill material(s) 150 (e.g., the nitride material 151).

Figure 14:
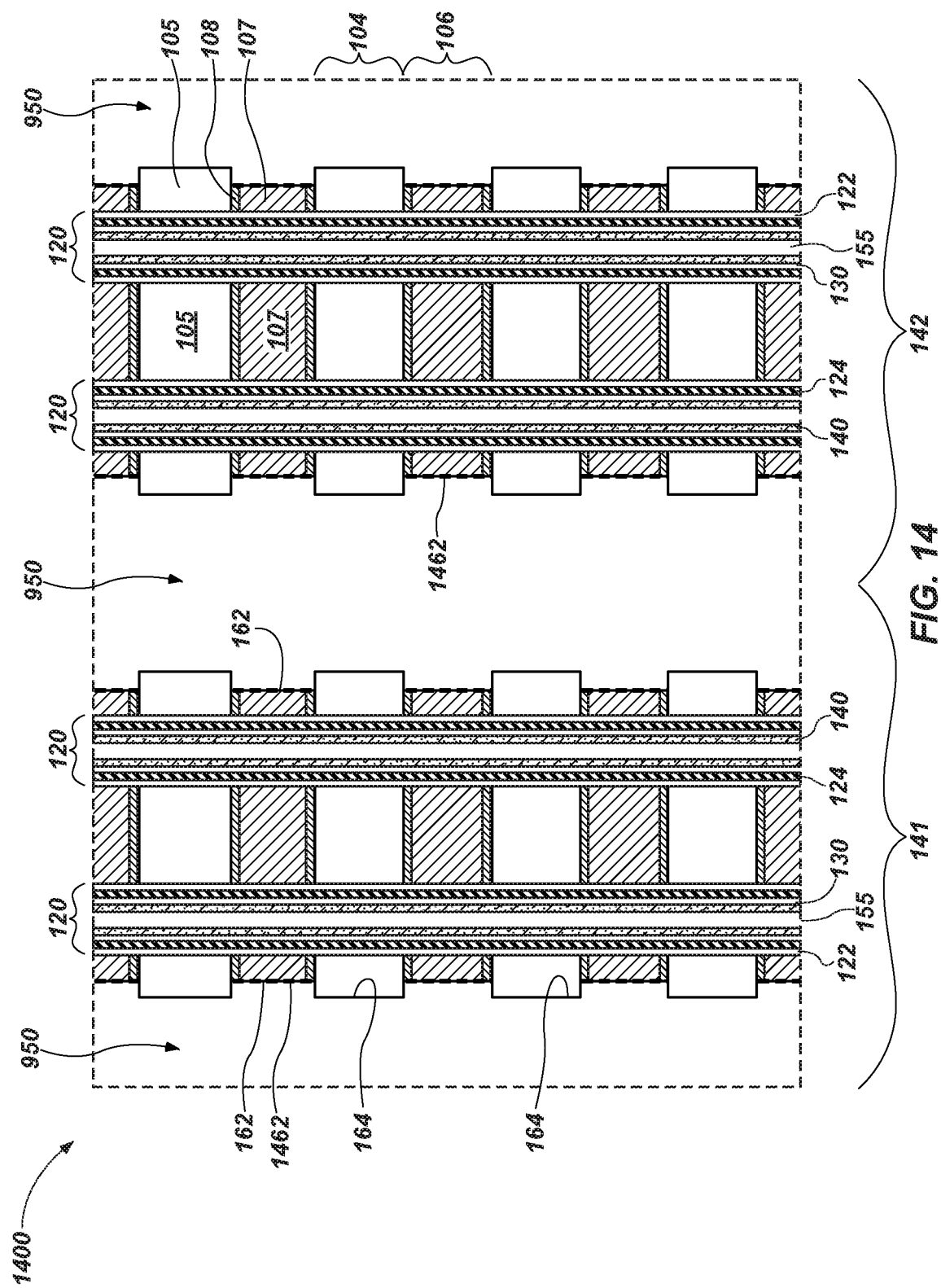
FIG. 14 is a cross-sectional, elevational, schematic illustration of a stage of processing to fabricate the structures of FIGS. 1 through 4, wherein the stage of FIG. 14 follows that of FIG. 9 (in the process to fabricate the structures of FIGS. 1 through 4) and precedes that of FIG. 10 in the process to fabricate the structure of FIG. 1, precedes that of FIG. 11 in the process to fabricate the structures of FIGS. 2 and 3, and precedes that of FIG. 12 in the process to fabricate the structure of FIG. 4.

In other embodiments utilizing a pretreatment before forming (e.g., depositing, growing) the additional conductive material 107', surfaces of the conductive material 107—and (if present) the other conductive material 108—exposed within the openings 950 of the intermediate structure 900 (FIG. 9) may be treated to promote formation of the additional conductive material 107' thereon. For example, with reference to FIG. 14, a formation-promoter 1462 may be formed (e.g., deposited) on the outer sidewall 166 of the conductive material 107 (and, if present, the other conductive material 108). The formation-promoter 1462 may comprise, consist essentially of, or consist of boron (B) or silicon (Si). In other embodiments, the formation-promoter 1462 may be a pristine surface of the conductive material 107 (and, if present, the other conductive material 108), resulting from, e.g., a wet clean or a dry clean process to which the outer sidewall 162 was exposed.

The formation-promoter 1462 may be formulated such that the additional conductive material 107' forms at a faster rate on the formation-promoter 1462 than on the insulative material 105, during formation of the additional conductive material 107' on the conductive material 107 (and, if present, the other conductive material 108). The intermediate structure 1400 of FIG. 14 may then be subjected to the subsequent fabrication stages of FIG. 10, etc., to form the structure 100 of FIG. 1, to the subsequent stages of FIG. 11, etc., to form the structure 200 of FIG. 2 or the structure 300 of FIG. 3, or to the subsequent stages of FIG. 12, etc., to form the structure 400 of FIG. 4. Accordingly, the structures 100, 200, 300, and 400 of FIGS. 1 through 4, respectively, may also include the formation-promoter 1462 between the additional material 107' of the conductive rails 160 (FIG. 1), 260 (FIGS. 2 and 3), 460 (FIG. 4) and the conductive material 107 (and, if present, the other conductive material 108).

In other embodiments, the additional conductive material 107', the conductive material 107, and the insulative material 105 may be formulated such that the additional conductive material 107' selectively forms (e.g., grows, deposits) on the conductive material 107 without a pre-treatment (e.g., inhibitor formation, promoter formation) between forming intermediate structure 900 of FIG. 9 and forming the additional conductive material 107'.

In still other embodiments, the additional conductive material 107' may be selectively formed on the conductive material 107 via cycling through formation and removal (e.g., etching) stages. During the formation stages, the additional conductive material 107' may be formed on all surfaces exposed in the openings 950 of the intermediate structure 900 of FIG. 9, but at a greater formation rate on the conductive material 107 than on the insulative material 105. Therefore, a greater amount of the additional conductive material 107' may form on the conductive material 107 than a lesser amount that forms on the insulative material 105. Between each formation stage, a removal (e.g., etching) stage may be conducted to remove some of the additional conductive material 107' at a consistent rate. Accordingly, the lesser amount of the additional conductive material 107' that had formed on the insulative material 105 may be removed while leaving at least some of the greater amount of the additional conductive material 107' that had formed on the conductive material 107. Repeating these formation and removal stages in a cycle enables the additional conductive material 107' to build up (e.g., deposit, grow) on the conductive material 107 without forming a lasting amount of the additional conductive material 107' on the insulative material 105.

Accordingly, disclosed is a method of forming an electronic device. The method comprises forming a structure comprising pillars extending through a stack. The stack comprises insulative material interleaved with conductive material. The pillars are grouped into blocks defined by openings extending through the stack. A portion of the conductive material, exposed in the openings, is removed to laterally recess the conductive material relative to the insulative material. An additional amount of the conductive material is grown in the openings. The additional amount of the conductive material protrudes into the openings from the conductive material, laterally beyond an outer sidewall of the insulative material.

Figure 15:
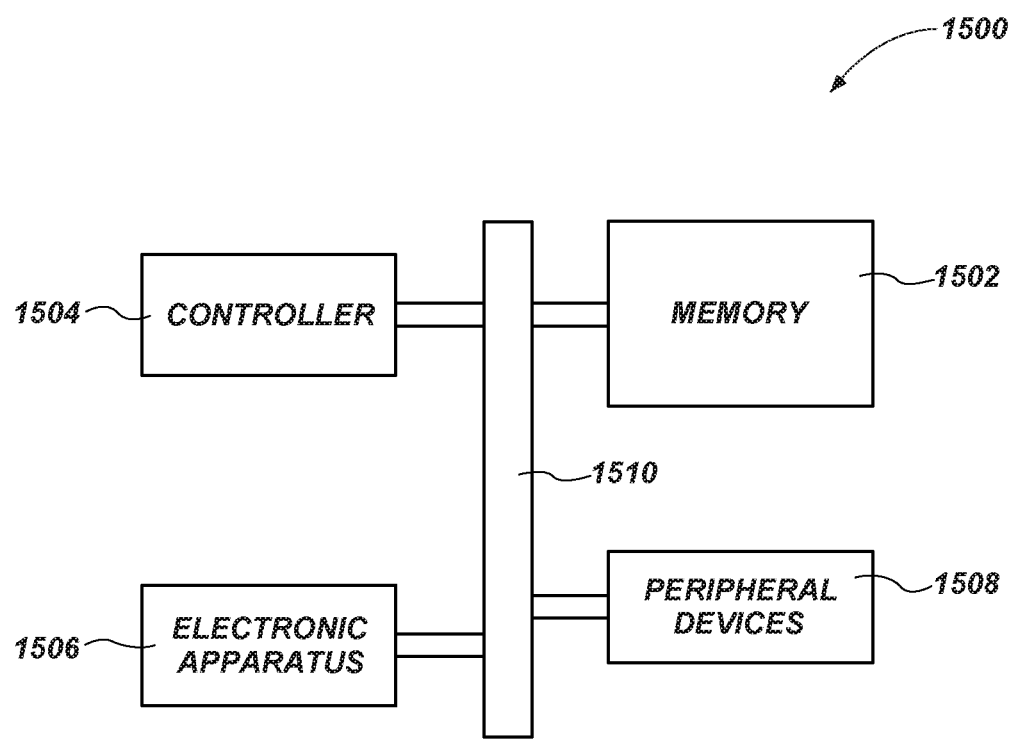
FIG. 15 shows a block diagram of a system that includes 3D NAND memory with the structures of any of FIGS. 1 through 4, according to various embodiments.

FIG. 15 shows a block diagram of a system 1500, according to embodiments of the disclosure, that includes memory 1502 with a vertical array (e.g., string) of storage devices (e.g., memory devices (e.g., memory cells)). The architecture and structure of the memory 1502 may include one or more of structures 100 (FIG. 1), 200 (FIG. 2), 300 (FIG. 3), 400 (FIG. 4), according to embodiments of the disclosure and fabricated according to one or more of the methods described above.

The system 1500 may include a controller 1504 operatively coupled to the memory 1502. The system 1500 may also include another electronic apparatus 1506 and one or more peripheral devices 1508. The other electronic apparatus 1506 may, in some embodiments, include one or more of structures 100 (FIG. 1), 200 (FIG. 2), 300 (FIG. 3), 400 (FIG. 4), according to embodiments of the disclosure and fabricated according to one or more of the methods described above. One or more of the controller 1504, the memory 1502, the other electronic apparatus 1506, and the peripheral device(s) 1508 may be in the form of one or more integrated circuits (ICs).

A bus 1510 provides electrical conductivity and operable communication between and/or among various components of the system 1500. The bus 1510 may include an address bus, a data bus, and a control bus, each independently configured. Alternatively, the bus 1510 may use conductive lines for providing one or more of address, data, or control, the use of which may be regulated by controller 1504. Controller 1504 may be in the form of one or more processors.

The other electronic apparatus 1506 may include additional memory with one or more of the structures 100 (FIG. 1), 200 (FIG. 2), 300 (FIG. 3), 400 (FIG. 4), according to embodiments of the disclosure and fabricated according to one or more of the methods described above. Other memory structures of the memory 1502 and/or the other electronic apparatus 1506 may be configured in an architecture other than 3D NAND, such as dynamic random access memory (DRAM), static random access memory (SRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral devices 1508 may include displays, imaging devices, printing devices, wireless devices, additional storage memory, and/or control devices that may operate in conjunction with the controller 1504.

The system may include, for example, fiber optics systems or devices, electro-optic systems or devices, optical systems or devices, imaging systems or devices, and information handling systems or devices (e.g., wireless systems or devices, telecommunication systems or devices, and computers).

Accordingly, disclosed is a memory device comprising an array of memory cells comprising blocks of pillars extending through a stack of insulative tiers interleaved with conductive tiers. At least one of the blocks comprises at least one of the conductive tiers having a greater width than a width of at least one of the insulative tiers.

While the disclosed structures, apparatus, systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. An electronic apparatus, comprising:
    a stack of conductive tiers interleaved with insulative tiers of the stack;
    a polymer material on outer sidewalls of each of the insulative tiers of the stack, the polymer material not extending along outer sidewalls of the conductive tiers of the stack;
    pillars extending through the stack, each of the pillars comprising a channel region; and
    fill materials extending through the stack adjacent the outer sidewalls of the conductive tiers and adjacent the polymer material on the outer sidewalls of the each of the insulative tiers of the stack,
    at least one conductive tier of the conductive tiers of the stack having a width greater than a width of vertically neighboring insulative tiers of the insulative tiers of the stack.

2. The electronic apparatus of claim 1, wherein the at least one conductive tier comprises:
    a region, proximate a pillar of the pillars, comprising a conductive material; and
    a rail, distal from the pillar of the pillars, comprising the conductive material, the rail defining a height equal to or greater than a height of the region.

3. The electronic apparatus of claim 2, wherein the region comprising the conductive material further comprises another conductive material.

4. The electronic apparatus of claim 3, wherein:
    the conductive material comprises tungsten; and
    the other conductive material comprises titanium nitride.

5. The electronic apparatus of claim 1, wherein the at least one conductive tier comprises a T-shaped rail of a conductive material, the T-shaped rail of the conductive material defining an outer sidewall of the at least one conductive tier.

6. The electronic apparatus of claim 1, wherein the at least one conductive tier comprises a mushroom-shaped rail of a conductive material.

7. The electronic apparatus of claim 1, wherein the at least one conductive tier has a planar upper surface and a planar lower surface along the width of the at least one conductive tier.

8. The electronic apparatus of claim 1, wherein the at least one conductive tier has a greater height proximate an outer sidewall of the at least one conductive tier than proximate a pillar, of the pillars, extending through the at least one conductive tier.

9. The electronic apparatus of claim 1, wherein an outer rail portion of the at least one conductive tier partially surrounds the outer sidewalls of the vertically neighboring insulative tiers.

10. The electronic apparatus of claim 1, wherein the fill materials comprise:
a polysilicon region interposed between regions of an oxide material; and
regions of a nitride material on the regions of the oxide material, the nitride material being directly adjacent the outer sidewalls of the conductive tiers and directly adjacent the polymer material on the outer sidewalls of the each of the insulative tiers.

11. A memory device, comprising:
a stack of alternating insulative tiers and conductive tiers, the stack divided into blocks;
a polymer inhibitor material on an outer sidewall of each of the insulative tiers, the polymer inhibitor material not extending along an outer sidewall of the conductive tiers;
fill materials extending between the blocks, the fill materials comprising a nitride material region, an oxide material region, and a polysilicon region; and
pillars extending through the stack, each of the pillars comprising a channel region, at least one conductive tier of the conductive tiers comprising:
a region proximate a pillar of the pillars and comprising a conductive material; and
a rail comprising the conductive material, the rail extending from the region proximate the pillar, away from the pillar, and beyond an outer sidewall of a neighboring insulative tier of the insulative tiers,
the nitride material region, of the fill materials, extending substantially conformally along an outer sidewall of the rail of the at least one conductive tier, the nitride material region extending adjacent the polymer inhibitor material,
the oxide material region, of the fill materials, extending along the nitride material region, and
the polysilicon region, of the fill materials, extending along the nitride material region.

12. The memory device of claim 11, wherein an upper surface of the rail is coplanar with an upper surface of the region comprising the conductive material.

13. The memory device of claim 11, wherein the rail extends vertically along a portion of the outer sidewall of the neighboring insulative tier.

14. The memory device of claim 11, wherein the rail defines a vertically-convex outer sidewall.

15. The memory device of claim 11, wherein the region proximate the pillar further comprises another conductive material.

16. The memory device of claim 15, wherein the other conductive material is directly adjacent the neighboring insulative tier along only a portion of a width of the neighboring insulative tier.

17. The memory device of claim 11, further comprising a formation-promoter material between the rail and the region proximate the pillar.

18. A method of forming an electronic apparatus, the method comprising:
forming a structure comprising pillars extending through a stack, the stack comprising conductive tiers of a conductive material interleaved with insulative tiers of an insulative material of the stack, the pillars grouped into blocks defined by openings extending through the stack, each of the pillars comprising a channel region;
removing a portion of the conductive material exposed in the openings to laterally recess the conductive material relative to the insulative material;
forming a polymer material on outer sidewalls of each of the insulative tiers of the stack, the polymer material not extending along outer sidewalls of the conductive tiers of the stack;
growing, in the openings, an additional amount of the conductive material, the additional amount of the conductive material protruding into the openings from the conductive material, laterally beyond the outer sidewalls of the each of the insulative tiers of the stack to form at least one conductive tier, of the conductive tiers of the stack, to have a greater width than vertically neighboring insulative tiers of the insulative tiers of the stack; and
forming fill materials extending through the stack adjacent the outer sidewalls of the conductive tiers and adjacent the polymer material on the outer sidewalls of the each of the insulative tiers of the stack.

19. The method of claim 18, wherein forming the structure comprising the pillars extending through the stack comprises:
interleaving the insulative material with a sacrificial material;
forming the pillars extending through the insulative material and the sacrificial material;
removing and replacing the sacrificial material with the conductive material; and
removing at least a portion of the conductive material to form the openings extending through the stack comprising the conductive tiers of the conductive material interleaved with the insulative tiers of the insulative material of the stack.

20. The method of claim 18, wherein growing, in the openings, the additional amount of the conductive material comprises growing the additional amount of the conductive material to at least partially overlap the outer sidewalls of the each of the insulative tiers of the stack.

21. The method of claim 18, further comprising, before growing the additional amount of the conductive material, forming a formation-promoter on a surface of the conductive material exposed in the openings.

22. A memory device, comprising:
an array of memory cells comprising blocks of pillars extending through a stack of insulative tiers interleaved with conductive tiers, at least one of the blocks comprising:
at least one of the conductive tiers having a greater width than a width of at least one of the insulative tiers;
a polymer inhibitor material on outer sidewalls of each of the insulative tiers, the polymer inhibitor material not extending along outer sidewalls of the conductive tiers; and
fill materials adjacent the outer sidewalls of the conductive tiers and adjacent the polymer inhibitor material on the outer sidewalls of the each of the insulative tiers.

23. The memory device of claim 22, wherein the at least one of the conductive tiers comprises:
a tungsten rail along the outer sidewall of the at least one of the conductive tiers; and
a formation-promoter material directly between the tungsten rail and the outer sidewall of the at least one of the conductive tiers.

24. The memory device of claim 22, wherein the outer sidewall of the at least one of the conductive tiers defines a curve through elevations of the at least one of the conductive tiers.

* * * * *

UNITED STATES PATENT AND TRADEMARK OFFICE
CERTIFICATE OF CORRECTION

PATENT NO. : 11,812,610 B2
APPLICATION NO. : 16/539700
DATED : November 7, 2023
INVENTOR(S) : John D. Hopkins, Rita J. Klein and Jordan D. Greenlee It is certified that error appears in the above-identified patent and that said Letters Patent is hereby corrected as shown below:

In the Specification

| | | |
|---|---|---|
| Column 3, | Line 56, | change "silicon-on-insulator ("SOT")" to --silicon-on-insulator ("SOI")-- |
| Column 8, | Line 10, | change "Pillars 120 extends extend vertically" to --Pillars 120 extend vertically-- |
| Column 9, | Line 25, | change "maximum width $W_1$ defined" to --maximum width $W_I$ defined-- |
| Column 9, | Lines 64-65, | change "conductive tier 106." to --conductive tier 106).-- |
| Column 13, | Line 40, | change "the width $W_1$ from" to --the width $W_I$ from-- |
| Column 13, | Lines 45-46, | change "the isolative insulative material 105" to --the insulative material 105-- |
| Column 13, | Line 48, | change "of a width $W_1$ of" to --of a width $W_I$ of-- |

Signed and Sealed this
Sixteenth Day of April, 2024

Katherine Kelly Vidal
*Director of the United States Patent and Trademark Office*